United States Patent
Innes et al.

(10) Patent No.: US 6,720,565 B2
(45) Date of Patent: Apr. 13, 2004

(54) REAL-TIME PREDICTION OF AND CORRECTION OF PROXIMITY RESIST HEATING IN RASTER SCAN PARTICLE BEAM LITHOGRAPHY

(75) Inventors: Robert Innes, The Sea Ranch, CA (US); Sergey Babin, Castro Valley, CA (US); Robin Teitzel, Portland, OR (US); Lee Veneklasen, deceased, late of Castro Valley, CA (US), by Mary Veneklasen, legal representative

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/057,324

(22) Filed: Oct. 26, 2001

(65) Prior Publication Data

US 2002/0148978 A1 Oct. 17, 2002

Related U.S. Application Data

(63) Continuation-in-part of application No. 09/343,960, filed on Jun. 30, 1999, now Pat. No. 6,373,071.

(51) Int. Cl.[7] .............................. G21K 5/10; H01J 37/08
(52) U.S. Cl. ..................... 250/492.22; 430/30; 430/942
(58) Field of Search .................... 430/30, 942; 313/389; 250/492.22

(56) References Cited

U.S. PATENT DOCUMENTS

| | | | |
|---|---|---|---|
| 4,988,284 A | 1/1991 | Liu et al. .................... 430/296 |
| 5,278,419 A | 1/1994 | Takahashi et al. ........ 250/492.2 |
| 5,847,959 A | 12/1998 | Veneklasen et al. ... 364/468.28 |
| 6,379,851 B1 * | 4/2002 | Innes .......................... 430/30 |
| 6,420,717 B1 * | 7/2002 | Babin et al. ............. 250/492.2 |

OTHER PUBLICATIONS

Babin et al., Quantitative Measurement of he Resist Heating in a Variable Shaped Electron Lithography (J.Vac. Sci.Tech. Mar./Apr. 1997).
Yasuda et al., Resist Heating Effect in Electron Beam Lithography ( J.Vac. Sci.Tech. May/Jun. 1994).
Babin et al., Experimental Verification of the TEMPTATION software tool (J.Vac. Sci.Tech. Nov./Dec. 1998).
Ralph et al., Resisting Heating in High Speed Electron Beam Writers (Beams Conf. 1982).
Ling, A method for estimatin the temperature distribution in an electron microscope specimen (Brit.J.Appl.Phys. 1965).
Abe et al., Resist heating in excimer laser lithography (J.Appl.Phys. 1988).
Babin, Measurement of resist heating in photomask fabrication (J.Vac.Sci.Tech. Nov./Dec. 1997).
Ralph et al., Resist heating in high speed electron beam pattern generators (proceedings, 1982).
Krasponerov et al., Heating of x–ray masks during e–beam writing (1998).

(List continued on next page.)

*Primary Examiner*—John R. Lee
*Assistant Examiner*—Erin-Michael Gill
(74) *Attorney, Agent, or Firm*—Greg Leitich

(57) ABSTRACT

The present invention relates to methods of predicting proximity heating of resists in electron beam lithography in real-time as the writing proceeds enabling beam compensation in current and/or dwell time to be performed during writing. A method of using a precomputed kernel capable of proximity resist temperature evaluation in real-time as beam writing proceeds by scalar product of the kernel with a graded cell size coverage map. A shifted impulse response function is shown to give the kernel values accurate to within a few percent.

20 Claims, 8 Drawing Sheets

OTHER PUBLICATIONS

Kratschmer et al., Resist heating effects in 25 and 500kV e–beam lithography on glass masks ( J.Vac. Sci.Tech. Nov./Dec. 1990).

Elb et al., Thermal Distribution and the effect on resist sensitivity in electron beam direct write (1989).

Vine et al., Heating effect of an electron beam impinging on a solid surface, allowing for penetration (Proc. IEE May 1964).

Groves, Theory of Beam Induced Substrate Heating.

Svinsov, Simulation fo heating in powerful electron lithograpy (Microelectronic Engineering 1995).

Greeneich, Electron–beam processes (1980).

Babin et al., Advanced model for resist heating effect simulation in electron beam lithography (1996).

Babin et al., CD variation in 30 kV EBL due to resist heating (SPIE 1997).

* cited by examiner

FIG. 6A

UNDERCORRECTION: δDOSE/δTEMPERATURE TOO LOW: PATTERN BLOOMING INCREASES AS TEMPERATURE INCREASES.

δDOSE/δTEMPERATURE CORRECT: CRITICAL DIMENSION (CD) OF TEST FEATURES DOES NOT VARY WITH TEMPERATURE.

OVERCORRECTION: δDOSE/δTEMPERATURE TOO HIGH: FOR THE RESIST AT HAND, THE DOSE REDUCTION AT HIGH TEMPERATURES IS EXCESSIVE.

REAL-TIME PREDICTION OF AND CORRECTION OF PROXIMITY RESIST HEATING IN RASTER SCAN PARTICLE BEAM LITHOGRAPHY

CROSS REFERENCE TO RELATED APPLICATION

This application is a continuation-in-part of U.S. patent application Ser. No. 09/343,960, filed Jun. 30, 1999 now U.S. Pat. No. 6,373,071, which is hereby incorporated by reference in its entirety as if fully set forth herein.

BACKGROUND OF THE INVENTION

1. Technical Field

This invention relates to the general field of particle beam lithography and, more particularly, to real-time correction of the lithography process to compensate for proximity heating of the resist. The particles may be electrons, photons, ions or uncharged particles, but the discussion will refer particularly to electron beam lithography, which presently is the method most commonly used to manufacture lithographic masks.

2. Description of the Related Art

The production of precise patterns on surfaces is a necessary stage in the fabrication of integrated circuits, and finds applicability in many other commercial environments as well. The typical method for creating such patterns is to coat the surface to be patterned with a chemical that undergoes a chemical transformation upon exposure to energy, a 'resist'. Positive resists undergo chemical transformation on exposure to energy leading to removal of resist from the surface in the regions so exposed. Negative resists undergo other chemical transformations, such as cross-linking, leading to removal of resist in regions not exposed to energy. After the resist in the appropriate pattern has been removed by exposure to the appropriate pattern of energy, the underlying surface may be subjected to further chemical etching or material deposition. Following surface etching or deposition, the remaining resist is removed.

The energy incident on the resist is typically either electromagnetic or a beam of particles, typically ions or electrons ('e-beam'). The energy may be directed onto the resist in one of two general ways: 1) through a mask having both transparent and opaque regions therein permitting selective passage of the incident energy to create the desired pattern of exposure on the underlying resist, or 2) as a focused beam, guided so as to impact selectively only those areas requiring exposure.

Exposure through a mask is the most common technique presently used for producing numerous identical patterns at reduced costs. However, the mask itself must first be made, most commonly by focused beam impact. Thus, focused beam exposure of resists is a necessary step in the production of masks for lithography.

Direct beam "writing" of patterns, although generally much slower, has several advantages over printing from masks. Among these are avoiding the complications of alignment and registration of the mask, and more precise patterning accomplished by precisely focused beams.

The electronics industry is driving to reduce the feature size of components. Smaller components, which are desired because of their higher switching speeds and lower power consumption, place increasingly critical demands on pattern accuracy. Precise patterning requires precise exposure of resist: Sharp and accurately positioned boundaries are desired between exposed regions and unexposed regions for both types of resist, to permit the pattern designer to use more densely packed components without interference and overlap of imprecisely exposed adjacent pattern.

For concreteness of our description, we will consider the case of positive resists, which are removed from the underlying layer for subsequent etching or deposition where the positive resist is exposed to the incident e-beam. Completely analogous effects are present for negative resists as well understood in the art.

Precise exposure of resist requires a detailed understanding of the sensitivity of the resist to e-beam exposure. The exposure of resist to an e-beam, called the dose, is typically measured in microcoulombs per square centimeter ($\mu C/cm^2$). The "sensitivity" of the resist means the electron dose (in $\mu C/cm^2$) necessary to create the desired pattern in the resist upon development. This sensitivity is a function of the resist composition, the energy of the incident electron beam, the temperature of the resist, the resist development process and other factors. The changes of resist sensitivity with its temperature at the time writing occurs are a particular concern.

Changing the temperature of the resist changes its sensitivity, which may require changing the dose of electrons in order to achieve proper exposure. Failing to take into account changes in resist sensitivity with temperature may lead to overexposure of the resist, exposure of the resist in regions not intended to be exposed, and less precise patterns. As will be described in greater detail below, pattern "blooming" (illustrated more particularly in FIG. 2, described below) is the undesired result.

A particular concern is a phenomenon known as "medium range proximity heating." In high voltage lithography, most of the electron beam energy passes through the resist and the underlying mask layer (typically very thin) and penetrates the substrate where most of it is deposited. (An exception occurs when thin substrates are used, typically in the manufacture of X-ray masks, where the substrate is itself a film so thin that most of the beam energy passes through it). Electron diffusion in a thick substrate deposits the heat from a single e-beam pulse or 'flash' in the substrate typically in a volume much larger in lateral extent (perpendicular to the e-beam direction) and also in depth into the substrate than the flash size. Subsequent thermal conduction transports a portion of this heat to the substrate surface where it heats the resist in a zone that may be tens of microns in lateral extent some microseconds following the flash, increasing to a millimeter across after many milliseconds. (Exact numbers will depend on beam energy, the composition of the substrate and its thermal properties). Such proximity heating depends on the previously written pattern and the time history of the pattern writing. It may result in temperature changes of tens of degrees. This variability makes proximity heating particularly challenging to estimate in designing a process for high accuracy e-beam writing There are two other proximity heating effects, termed "nearby flash heating" and "global heating" which are not to be confused with this "medium range substrate heating." These other effects may also require real time compensation but occur on very different time and distance scales and require different methods. Nearby flash heating can be compensated by simple table lookup of pre-computed temperatures. However, this lookup may have to occur very rapidly, e.g., on a nanosecond time scale. Global heating of the entire substrate may also require real-time prediction which cannot ignore the mask boundaries. It causes thermal expansion on a time scale of minutes and hours, even though the temperature rise is not large.

"Proximity heating" as used herein is not to be confused with "proximity effect" which is a term commonly used to describe the unwanted exposure of the resist by electrons backscattered from the substrate. Corrective measures are taken to compensate for this undesired exposure which, however, also is affected by heating of the resist.

FIGS. 1A and 1B illustrate beams of low and high energy electrons, respectively, incident on a substrate. The general mode of operation of e-beam lithography makes use of a focused beam of electrons, accelerated through a voltage, typically 1000 volts (1 keV) and above. Lower voltage e-beams are more effective at exposing the resist. Higher voltage e-beams are preferred for their ability to be formed into more precisely focused beams, and with less scattering in the resist layer, resulting in more accurate lithography and the ability to fabricate smaller patterns. "High voltage" e-beams herein is commonly understood to mean e-beam energies above approximately 10 keV. Beam energies as high as 50–100 keV are used. However, high energy e-beams produce undesired heating side effects.

FIG. 1A depicts schematically and in cross section a beam of low energy electrons (less than approximately 10 keV) 104$a$ incident on a layer of resist 103$a$. Typically, resist layer 103$a$ will be relatively thin, around 0.5 $\mu$m ("microns"=$10^{-6}$ meter). Resist 103$a$ overlies the layer to be etched 102$a$, all of which typically are supported by a reasonably thick substrate. For the manufacture of lithography masks, layer 102$a$ will be generally be the mask material, typically a film of proprietary composition containing chromium and commonly very thin compared to the resist layer. Substrate 100$a$ is typically glass and may be considered to be infinitely thick as none of the effects encountered in e-beam lithography relevant to the invention described herein are affected by the lower surface or edges of a thick glass layer (not depicted in FIG. 1A). Very thin substrates as would typically be encountered in the fabrication of x-ray lithography masks are an exception. FIG. 1A (in common with all other figures herein) is schematic only and not drawn to scale.

For a low energy beam as depicted in FIG. 1A, significant spreading of the e-beam occurs in the resist layer, commencing virtually immediately upon impact with the resist surface. The spreading of low energy e-beams in width may be commensurate with the depth of penetration. Thus, low energy e-beams tend to scatter in the resist layer, exposing thereby a larger range of resist than desired and exposing the resist in different patterns than intended, broader than the incident beam. This "pattern blooming" can also result from the chemical interaction of scattered electrons. Backscattering from layers underlying the resist layer also can lead to unwanted exposure and pattern blooming.

The creation of precise patterns on layer 102$a$ is facilitated by minimal spreading of the e-beam on passage through the resist, which favors the use of higher energy beams. Higher energy beams also produce unwanted backscatter from deeper layers of the substrate, but the backscatter is more diffuse and tends to lower contrast rather than diffuse edges. Use of high energy beams requires both higher voltage and higher beam currents. Low energy e-beams deposit a reasonably large fraction of the beam energy in the resist layer where it is needed to expose the resist. Therefore, low energy e-beams require less incident beam intensity (beam current) since more efficient use is made of the available beam intensity in exposing the resist. The energy deposited in the target is thus typically significantly less for low energy e-beams since both current and voltage are reduced from that used in high energy e-beam lithography. That is, energy deposited is the product of beam voltage, beam current and exposure duration (dwell time). When the beam voltage is increased the electrons leave less energy in the resist, so the current must also be increased to compensate to produce the correct degree of exposure.

By way of illustration and not limitation, we compare the exposure of resist by a 10 keV beam with that caused by a 50 keV beam. It is noticed experimentally that as beam energy increases, the current must increase almost linearly with beam energy to continue to expose the resist adequately. Thus, increasing the beam energy by a factor of 5 from 10 to 50 keV requires a concomitant increase in current by a factor of approximately 5 to adequately expose the resist. The energy deposited per e-beam pulse (or flash) is (volts)·(amps)·(pulse duration) which increases by a factor of approximately 25 in this example.

FIG. 1B depicts schematically in cross section (not to scale), e-beam 104$b$, incident on resist 103$b$, at high incident beam energies, typically around 50 keV. Beam spreading depicted as 5 in FIG. 1A is typically negligible in the resist layer 103$b$ for high energy beam impacts as depicted in FIG. 1B. Such high energy beams tend to pass through resist layer 102$b$, mask layer 103$b$, and proceed well into the glass substrate 100$b$, before substantial beam spreading occurs. A heated zone 106 is thereby created in substrate 100$b$ as the e-beam comes to rest. Typically, for electrons of about 50 kV in glass, zone 106 will be approximately 20 $\mu$m in diameter ($\mu$m=micron=$10^{-6}$ meter) with its centroid about 10 $\mu$m below the upper surface of glass substrate 100$b$ and for small flashes or round spots, the heated zone will have rotational symmetry about the axis defined by the incident e-beam.

As noted above, high voltage e-beams will typically deposit much more energy in substrate 100$b$ than will low voltage beams, such energy increasing by approximately the square of the beam energy (as the need for increased current must also be met). The energy per pulse may not be substantial, but millions or indeed hundreds of millions of pulses may contribute to the proximity heating. Therefore, substantial heating of the substrate 100$b$ may occur with high energy electron beams.

Direct heating of the resist layer by the incident e-beam is significant, but is readily predictable from the applied dose and, therefore, can be compensated by calibration. However, proximity heating of the point at which writing is currently occurring is variable since it is affected by heat conduction from regions within the substrate where heat was deposited by numerous (typically millions) of earlier pulses. Thus, proximity heating depends on the pattern being written and the timing and ordering of past pulses. This proximity heating results in pattern blooming, which must be compensated for if high energy beams are used.

FIG. 2 depicts the effects of pattern blooming that will typically result from increasing resist sensitivity due to proximity heating. The desired pattern of exposed resist 107 is shown in top view (FIG. 2A) and side view (FIG. 2B). The pattern and process designer will plan for e-beam exposure such that exposure point 109 (for example) occurs at the desired pattern boundary. However, increased resist sensitivity may lead to full exposure of resist by less-than-expected e-beam dose. That is, the pattern edge moves to position 110, resulting in a broadened pattern depicted by 108.

Proximity heating has been the subject of several calculations and measurements. Ralph et. al. describe methods for computing proximity heating by numerical integration of diffusion equations in "Proceedings of the Symposium on Electron and Ion Beam Science and Technology, Tenth International Conference", p. 219–2330 (1983). Babin et. al. also describe methods for the numerical simulation of proximity heating and the comparison of such calculations with measured values. SPIE, Vol. 3048, p. 368–373 (1997) and J. Vac Sci Technol. B Vol. 16, pp. 3241–3247 (1998). Additional calculations of proximity heating and comparison with measured values have been reported by Yasuda et. al. in and J. Vac Sci Technol. B Vol. 12, pp. 1362–1366 (1994).

Calculations of proximity heating are typically based upon a numerical solution of the appropriate diffusion (partial differential) equations. Heat sources may be represented by analytic approximations, or derived directly by numerical Monte Carlo simulation of the electrons penetration into targets, including resists, masks and substrates. However, prior methods have proven in practice to be too slow in comparison with the speed of e-beam writing to allow real-time computation of proximity heating and adjustment of the writing process in response. More particularly, accurate predictions require using Monte Carlo simulations to represent single flash heat sources in the substrate and may use various techniques for solving the thermal diffusion equation including finite element, finite difference or elaborate analytical approximations. However, these methods tend to require lengthy computations and cannot be used directly in real time proximity heating correction.

As such, there is a need for an improved system and method for compensating for medium range substrate heating. There is a further need for compensating for medium range substrate heating in real time.

SUMMARY OF THE INVENTION

These and other drawbacks in the prior art are overcome in large part by a system and method according to embodiments of the present invention. More particularly, methods and procedures for determining resist temperature during exposure are described. The change of sensitivity of the resist with temperature is determined a priori experimentally. Once the temperature at the exposure point is known, as determined by techniques according to embodiments of the present invention, the exposure parameters can be changed using known techniques to compensate for the temperature change. Typically, the resist temperature rise predicted by embodiments of the present invention for the point of writing will be multiplied by a factor relating the temperature sensitivity of the resist. The result is a correction applied to the beam dose by controlling the beam current, or equivalently the flash dwell time, to provide more accurate resist exposure. Pattern blooming is thereby reduced.

Embodiments of the present invention relate to methods of predicting proximity heating in real-time as the writing proceeds, enabling dose compensation to be performed in real-time. Methods of achieving high-processing efficiency are described which allow the calculations to be done in real time as writing proceeds. An analytic shifted impulse response function is shown to give raster scan proximity heating results accurate to within a few percent. It is used for fast evaluation and design of correction schemes.

Methods according to implementations of the present invention prevent or mitigate pattern blooming as incident electrons heat the resist and broaden the region of exposure. Proximity heating is predicted in a very rapid manner, thereby making it possible to compute proximity heating corrections to the e-beam process in real-time as the process proceeds. The prediction occurs on a time scale comparable with the e-beam writing speeds. This real-time prediction of proximity heating allows the properties of the e-beam and/or the writing process to be adjusted while writing is underway to compensate for proximity heating. The resist temperature at the point of writing from the earlier written pattern is determined and the data enabling appropriate beam adjustments to compensate for the resulting exposure dose error are provided.

BRIEF DESCRIPTION OF DRAWINGS

A better understanding of the invention is obtained when the following detailed description is considered in conjunction with the following drawings in which:

FIG. 6A and 6B illustrate a kernel of typical e-beam writing procedure showing typical contributions to proximity heating in °K above ambient as a function of lateral position of earlier writing relative to the correction point and as a function of the past beam scan line count;

DETAILED DESCRIPTION OF THE INVENTION

FIGS. 1–9 illustrate an improved system and method for medium range proximity heating compensation according to an implementation of the present invention.

As will be explained in greater detail below, a system according to an implementation of the present invention defines a "cell" structure, each cell being a grouping of pixels. Then, each cell is assumed to have uniform coverage (i.e., all pixels have equal intensity within each cell, although coverage may differ from one cell to the next). A thermal diffusion equation is used to solve for a set of "kernel" values for each cell, assuming full nominal coverage within each cell. The kernel values, which are temperatures due to each cell in the cell structure caused at current point of writing, are stored for later use in the real time calculation. Restrictions on the shape or size of the cells are not imposed; nor is it required that they be composed of contiguous pixels. Thus, cell structures may be found that maximize the accuracy and economy of the real time calculation for the writing strategy at hand.

During real time writing, a coverage map is then constructed for the predetermined cell structure, the coverage map being actual pixel intensity values associated with the pattern being written. The actual pixel intensity values are aggregated and stored according to the cell structure previously defined. During the current electron beam scan, for the current point of writing or its neighborhood, the precomputed "kernel" is applied to the relevant cells to determine their contributions to the proximity heating of the current pixel or pixel neighborhood being written.

Once the temperature is determined, the dose correction can be applied for the pixel or pixel neighborhood being written. The dose correction is applied through a priori knowledge of the relationship between temperature and resist sensitivity for the particular resist in use: The commonly used Novolac resists change their sensitivity with temperature by approximately 0.2% per °C., so a 20° C. variation in resist temperature will vary its sensitivity by approximately 4%. Unless this equivalent dose error is corrected it will have a non-trivial blooming effect on e-beam patterns especially for very fine lithography.

Figure 3:
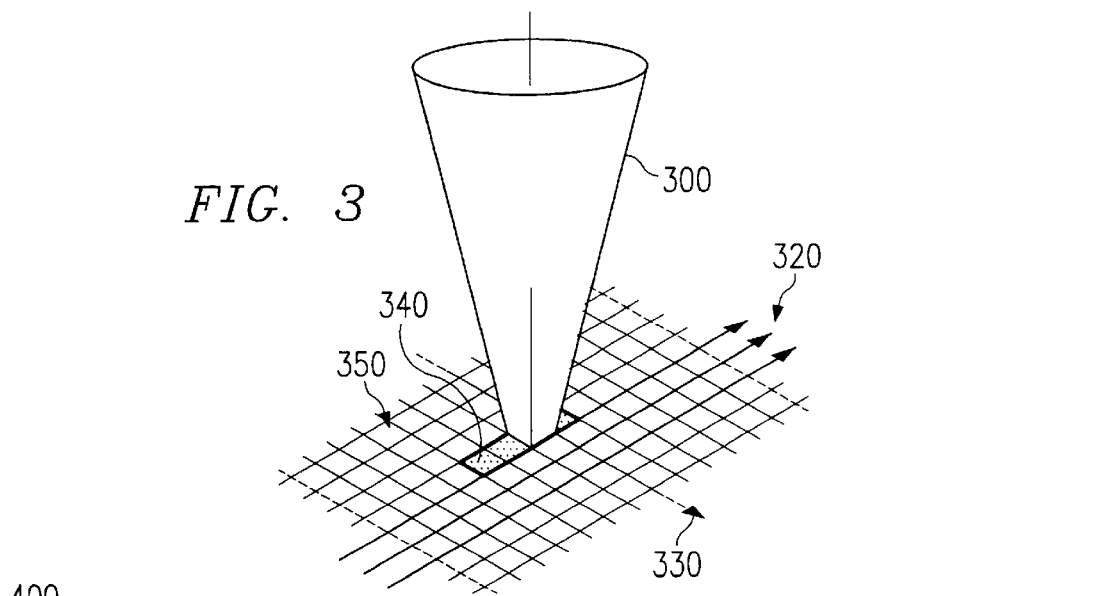
FIG. 3 is a representation of coverage from a raster scan according to an implementation of the invention.

Turning now to the drawings and, with particular attention to FIG. 3, a diagram illustrating raster scanning is shown. Raster scan electron beam lithography machines typically scan the electron beam in a linear path about 1 mm in length every 25 microseconds typically as the mechanical stage moves the substrate in an orthogonal direction at a speed of roughly 1 cm/sec. One or more round or otherwise shaped electron beams 300 are scanned periodically in a first direction 320 while stage motion in a second, orthogonal direction 330 provides for exposure of each pixel 340. Pixels are typically in the range of approximately 0.05 microns to 0.2 microns in diameter to write features having a size in the range of approximately 0.2 to 2.0 microns. Exposure data for each pixel 340 is expressed as an exposure level $P_{ij}$, where i and j are indices for the grid 350. Where the electron beam 90 is on or off, $P_{ij}=1$ or 0, respectively. More complex systems might use more exposure levels (e.g., 64) $P_{ij}=0$ to 63. These levels are implemented usually with dwell time changes but may also be implemented with beam current changes.

The time between the end of one beam scan and the start of the next is about 5 microseconds, called "flyback time." Both the beam and stage scan sequences may be raster or serpentine: the term "raster" is being used here to include both. The temperature of the resist due to earlier writing may vary by tens of degrees along the electron beam scan path which requires that the dose correction be updated roughly every microsecond. These are approximate numbers that depend on the precise pattern being written, the e-beam machine used, scan field sizes, the nature of the substrate, the required accuracy, resist sensitivity, and other factors.

Vector scan machines direct the beam only to those places where writing is needed, a potential throughput advantage over raster scan. However, the pattern independence of the raster scan kinematics makes proximity heating correction possible with a pattern independent list of precomputed numbers called a "kernel." The kernel is discussed below. The kernel may or may not be dependent on the location of the neighborhood where writing is current. Serpentine scan kernels are pattern independent, require an additional index into the kernel array of numbers depending on the location of the point where the correction is being applied: Pure raster scan does not require this index. In vector scan, the scanning kinematics is pattern dependent. This requires a pattern dependent kernel, which in general would have to be computed in real time. This advantage of raster/serpentine scan for proximity heating correction purposes is augmented by the fact that proximity heating temperatures potentially are much lower in raster scan than vector scan. It is observed that raster scan machines, in which the beam scan generally is much longer than the size of the electron diffusion heat ball of a single flash, may increase resist temperatures by temperatures of the order of 20° C. for typical resists in current use, such as Novolac. Vector scan machines writing on the same resist at the same throughput may increase resist temperature up to 100° C., because their electrostatic beam deflection writing field size is not much larger than the heat ball of a single flash and there is a severe throughput penalty in not completely filling a field with writing before moving the beam using the magnetic beam deflection to the next field.

As discussed above, implementations of the present invention relate to methods for predicting the proximity heating of the resist for the purpose of computing proximity heating in real-time as e-beam writing is underway. The primary advantage of real-time evaluation of proximity heating is best understood in view of the detailed performance of e-beam lithography equipment as used in the manufacture of integrated circuits.

A typical modern integrated circuit (such as Pentium® microprocessor or the like) may contain $10^7$ transistors and be fabricated in 20 or more layers of lithography. Each lithography layer requires a mask, typically manufactured by means of e-beam lithography. The chip designer provides a data file containing the information as to how the components are to be arranged on the chip, layer by layer. This data file typically has a format referred to as "GDS II" that is hierarchical in format in the interests of economy. For example, if a pattern occurs repeatedly in a larger pattern, the subpattern called a 'cell' need be specified only once. Then, its occurrences in the larger pattern need only be specified as to location and orientation. Cells may contain elementary geometries, other cells, arrays of other cells and so on. The GDS II structure thus grows hierarchically to define completely the circuit structure from a collection of subsystems, sub-subsystems, etc. down to elementary geometries to make mask features for fabricating the most elementary components.

The GDS II file is not organized in a manner that a typical e-beam lithography machine can directly use to write a mask. Therefore, the GDS II file must be 'fractured' into individual layers and into the geometrical order in which the e-beam machine will write the masks. 'Flat format' is the typical description of the fractured GDS II file, providing in the non-hierarchical 'flat file' the information for writing the lithography masks for use making integrated circuits. Raster scan e-beam machines would typically need to fracture the GDS II file into 1 mm strips for raster scanning, sorted into the order in which they will be written. Vector scan e-beam machines may require a different fracturing.

Fractured into the flat format, the resulting file would typically be very large. For example, if a pixel is 0.1 micron ($10^{-7}$ meter), a 10 cm by 10 cm mask will contain $10^{12}$ pixels. If each pixel requires 1 byte of information to specify the e-beam properties for that pixel, $10^{12}$ bytes (1,000 Gbyte) would be required to store all the information in flat format. Therefore, fracturing the compact GDS II format into the flat format is typically done as needed in real-time for immediate use by the e-beam writing machine. Proximity heating must be calculated from the flat format since, unlike the GDS II format, the flat format contains the information pertaining to the spatial and time order in which the pixels will be written. Prior to fracturing, the GDSII file does not contain timing information nor does it contain the spatial information for the e-beam writing in a directly accessible form.

In principle, it would be possible to calculate proximity heating effects for a stipulated e-beam lithography process in advance of actual performance of the process. Thus, one could select a candidate e-beam writing process, specifying all beam and scanning parameters. For any pattern, the proximity heating could be computed using the methods referred to above taking however long may be necessary. The candidate process parameters would then be adjusted to compensate for proximity heating effects. If necessary, the cycle of proximity heating calculation and parameter adjustment could be iteratively re-done as many times as necessary to converge to a stable set of processing parameters. All of this would be performed off-line (that is, before e-beam lithography begins and typically remote from the e-beam equipment itself). For most practical applications however, this approach is prohibitive because it would increase processing time, require an additional processing step and require an exact prediction of the timing of the writing kinematics and fail if the actual writing did not follow the prediction.

Implementations of the present invention relate to methods of predicting proximity heating in a time scale comparable with the time of e-beam writing. The GDS II file as typically produced by the chip designer is fragmented into the flat format for concurrent use by the e-beam lithography machine and by a method in accordance with an embodiment of the present invention. Unlike previous methods for calculating proximity heating, a method according to an implementation of present invention is capable of predicting the proximity heating of resists in a time scale that permits adjustment of the modern e-beam writing process in response thereto.

Figure 4:
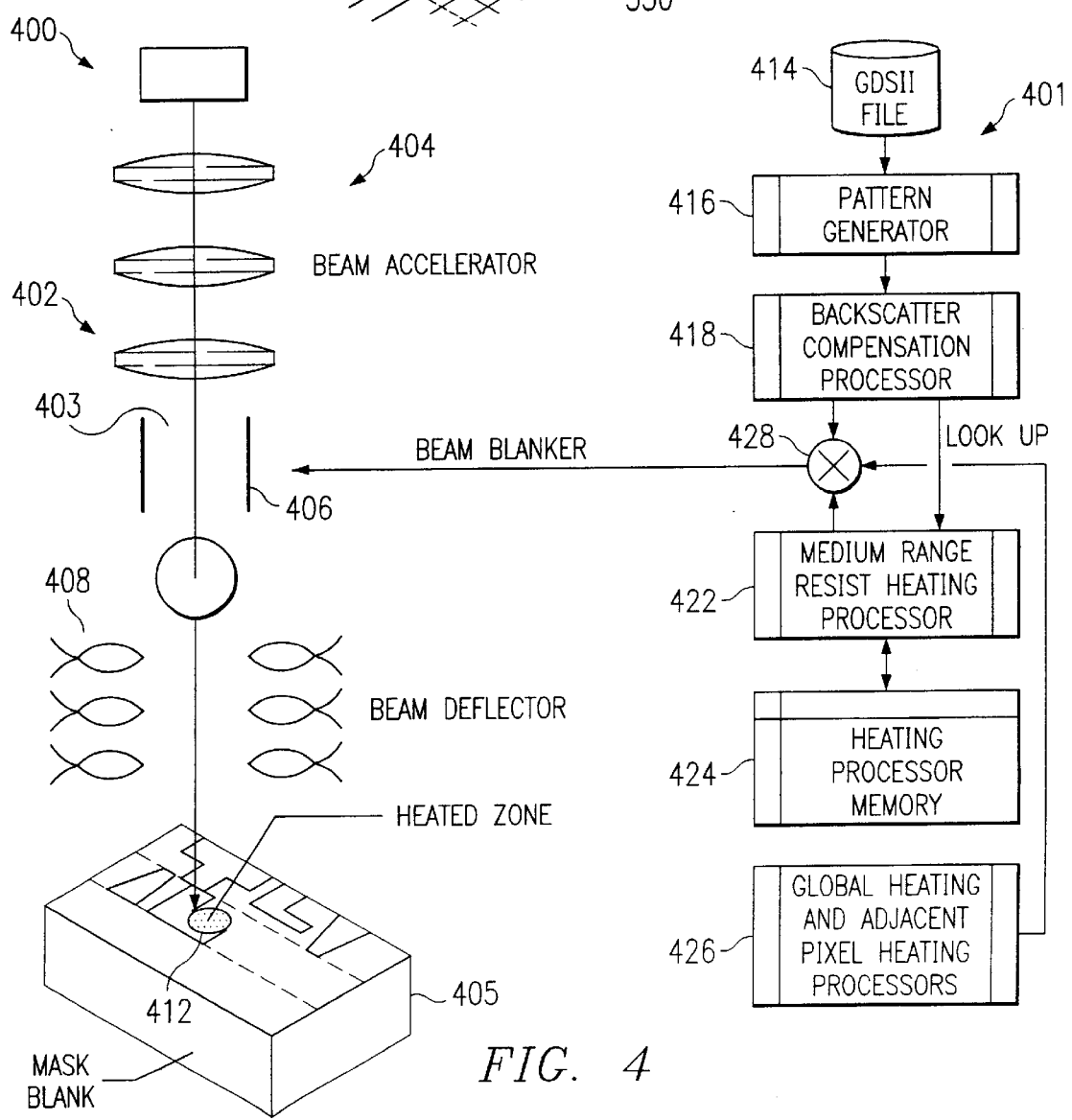
FIG. 4 is a diagram illustrating schematically operation of an implementation of the invention.

FIG. 4 schematically illustrates an electron beam lithography system in accordance with an implementation of the present invention. The system 400 includes a control and compensation system 401 and an electron beam column 402. In the electron beam column 402, an electron beam 403 is generated, accelerated in a beam accelerator 404, and applied to a mask blank 405. The column 402 further includes a beam blanker 406 and one or more beam deflectors 408. The beam blanker 406 and beam deflectors 408 focus and adjust the electron beam. Any of a variety of electron beam systems may be used in conjunction with the teachings of the present invention. One such a system is the MEBES system, available from Etec Systems, Inc., Hayward, Calif.

As will be explained in greater detail below, the control and compensation unit 401 controls operation of the beam blanker 406 to compensate for the effects of the heated zone 412. More particularly, the GDSII file or some other equivalent file 414 is loaded into a pattern generator 416 in flat format for the heating compensation. The various heating and compensation processors use this flat format file to generate correction values.

As shown, the control and compensation system 401 includes a backscatter compensation processor 418, a medium range resist heating processor 422 coupled to a heating processor memory 424, and a global heating and adjacent pixel heating processor 426 which may or may not be present. As will be described in greater detail below, the medium range resist heating processor 422 and heating processor memory 424 implement heating compensation according to an embodiment of the present invention. The backscatter compensation processor 418 compensates for the proximity effect, for example, in a known manner, as described above. The global heating and adjacent heating processor 426 compensates for global heating, as described above. Once the compensation processors have compensated for their respective effects, a look up table 428 or similar process is employed to convert the compensation values obtained to dose values, which are then applied to the mask.

It is noted that, while illustrated as discrete units, the various heating and compensation processors may be implemented as one or more software modules executed by one or more processors or controllers and associated memory. Alternatively, the compensation and heating functionality may be implemented as one or more application specific integrated circuits (ASICs), or combinations of hardware and software or ASICs and general purpose or digital signal processors. Thus, the figure is exemplary only.

An embodiment of the present invention makes use of the classical thermal diffusion equation, Eq. 1

$$(c\partial/\partial t - \kappa \nabla^2)T(r,t) = [P(r,t)*D(\rho)] \qquad \text{Eq. 1}$$

where T is the temperature, r is the position, t is time, c the volumetric heat capacity and $\kappa$ the thermal conductivity of the substrate. $\nabla^2$ is the Laplacian operator. P(r,t) is the pattern exposure sequence, the "coverage," traced by the electron beam in writing the pattern. D($\rho$) is the electron spatial energy diffusion function in the substrate relative to the location of each flash as may be given by an electron diffusion Monte Carlo. $\rho$ is a vector in 3 dimensional coordinate space relative to the flash location. [P(r,t)*D($\rho$)] denotes the convolution of P and D. The convolution [P(r, t)*D($\rho$)] may usefully be considered to be the rate of energy deposition per unit volume at specified points in space and time in the substrate. Equation 1 is well studied in mathematical physics and several techniques for its solution exist, including commercial thermal prediction software such as ANSYS. However, prior techniques are much too slow to provide thermal predictions in real time to control the e-beam writing process One known way to solve Eq. 1 more rapidly for complex patterns is to solve it for a single electron beam flash and linearly superpose the resulting calculated temperature function of position and time over all flashes in the writing sequence. This linear approximation has been found to give temperatures in good agreement with those typically encountered in e-beam lithography and is justified by the linearity of the differential equation from which Eq. 1 is derived when the thermal parameters are independent of temperature and because the boundary conditions can be considered invariant on the distance scale of this type of medium range proximity heating. Temperature rises encountered for raster scanning are typically moderate and no significant error is introduced by assuming that thermal parameters of the material are independent of the temperature.

Thus, linear superposition of temperatures is expressed as:

$$T = \Sigma_i K_i P_i \qquad \text{Eq. 2.}$$

where $\Sigma_i$ denotes summation over all i. T in Eq. 2 denotes the temperature rise over ambient temperature at the present point of beam writing. $P_i$ is coverage (the writing) by the e-beam at the $i^{th}$ pattern pixel on a scale of 0 (no e-beam writing) to 1 (fully covered and exposed pixel i). The $K_i$ denote the temperature rise at the present point of writing due to a fully exposed pixel (P=1) at location i in Eq. 2. (i is given here as a single index for simplicity of exposition but it is really a double index that covers the stage scan dimension and beam scan dimension).

The calculation of the $K_i$ can expediently be done by solving Eq. 1 for a single fully exposed flash convolved with a point source Monte Carlo map of electron scattering energy deposition in the material layers, tabulating the solution $T(r,t)$, (where r is the surface distance from the flash to the point of correction and t the elapsed time), over a range of distance and time to cover the distance and time interval from the most remote pixels that can contribute significantly to proximity heating. At high beam voltages where resist proximity heating is a problem, it makes little difference whether the flash is considered a point source, a gaussian spot or a small shaped flash, because the scale of electron scattering is much larger than the flash size. Thus, even if the flash is not rotationally symmetric this allows the convenient assumption of rotational symmetry of the solution to Eq. 1, $T(r,t)$, for a single fully exposed flash. Knowing the relative locations and times of the point of correction and of the pixel $P_i$, one can interpolate in the function $T(r,t)$ to get the value of $K_i$ for each value of i instead of solving Eq. 1 separately for each $P_i$. The resulting array of the $K_i$ is referred to as the "kernel" and denoted with the shorthand symbol K.

As described in Veneklasen et al., U.S. Pat. No. 5,847,959, which is hereby incorporated by reference in its entirety as if fully set forth herein, in raster scan machines, the resulting kernel K is independent of the electron beam scan position within a stage scan and independent of the position of the beam in the current beam scan. The reason for this independence in raster scan is that the heating effect of a given pixel in a remote earlier scan depends only on the relative positions of the pixels and not on the position of the beam scan line in the stage scan or on the position of the beam in the current scan line. This is not strictly true of serpentine scanning in which the scan direction alternates, because the lapsed time between pixels that are relatively spatially invariant generally does depend on the position of the beam in the beam scan: The heating effect is both a time and space dependent effect. However, as will be shown, the additional procedure to compute proximity heating in a serpentine scan machine is a simple modification of basic procedure for raster scan: In the following discussion we consider the machine to be strictly raster scan in which the beam scan is always in one direction and the flyback in the other direction. The index i can then be thought of as taken relative to the current beam position. Thus in raster scan writing strategies, the kernel K can be precomputed and need not be computed in real time. The kernel K depends on beam energy, writing strategy and substrate material but in raster and serpentine scan machines K does not depend on the pattern being written. Thus, for raster or serpentine machines and for any strategy in which the writing kinematics does not depend on the pattern being written, the K can be precomputed by accurate (albeit slow) methods and tabulated for use in the real-time heating prediction. Serpentine scanning introduces a complication, but it is minor because in practical situations only a small portion of the kernel is time dependent and it also may be precomputed and tabulated.

The goal is to correct proximity resist heating in real time using dose modification. To do this, the pattern dependent temperature rise at the point of exposure must be calculated. In principle, this could be done by adding up the temperature rises at this point due to all previously exposed pixels in the pattern. However, thermal diffusion has a very long range and depends upon proximity in time as well as position. A very large number of pixels contribute to this temperature rise. In the zone of past writing that affects the temperature at the current point of writing, there may be $10^8$ writing pixels. A correction may need to be computed roughly every microsecond at tens of points along the current beam scan in real time. Running the index i over $10^8$ values in Eq. 2 is prohibitive in this time and i can at most run over 100 to 1000 terms with present day machines. Thus an economy of a factor of roughly one hundred thousand to one million without significant loss of accuracy may be required. According to implementations of the present invention, this economy is obtained to permit the calculation to be done in real time.

The solution is to break Eq. 2 into a single summation done in real time over precomputed summations of cells of writing pixels assumed to have of 100% coverage. The precomputed summations resulting in solutions for the kernel values K, are done by exact calculation "off line" (that is not in real time) once and for all, however long these calculations may take. This requires dividing the scanned area into cells of writing pixels considerably fewer in number than the writing pixels they contain and treating all pixels in a cell as through they had the same unit energy input in determining the cell's contribution to the temperature rise. This does not mean that each pixel is considered to contribute the same temperature at the point of correction: The temperature contribution of each pixel is computed separately from the precomputed solution to the thermal diffusion equation, but in computing the aggregate temperature contribution of all the pixels of a cell, each pixel is assumed to contribute the same unit of energy to the thermal diffusion equation source function. Thus, in actual writing, if all of the pixels in the cell for a given pattern also had the same energy contribution but different from unity, the temperature contribution of the cell can be computed exactly by linear scaling. Error in the real time calculation can only arise if the pixels in the cell contribute different amounts to the source function. The worst case error in this case is computable in a way that is described later.

Figure 5:
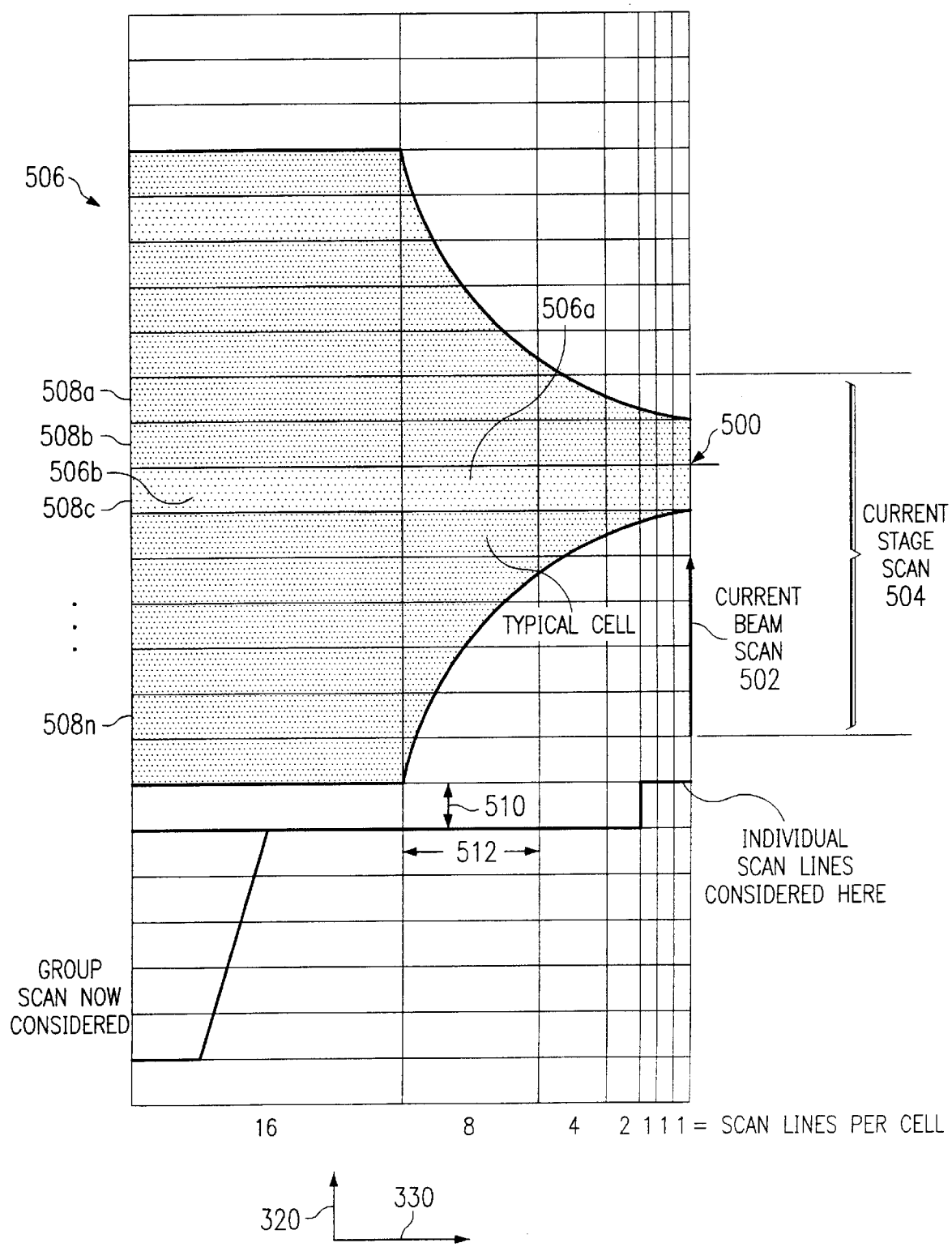
FIG. 5 is a diagram schematically illustrating an exemplary correction kernel according to an implementation of the invention.

An example of a basic cell kernel 501 is shown schematically in FIG. 5. More particularly, FIG. 5 illustrates a point of beam impact 500, a current beam scan 502, and a current stage scan 504. A plurality of cells 506 make up the kernel 501.

During the actual writing, the resulting kernel is applied to the point of writing to determine the contributions to increased temperature at the writing point from adjacent cells. To reduce the number of cells 506 to a reasonable number, a technique called "graded cell sizing" is used. "Thermal correction cells" are defined to be aggregates of pixels that are considered as a group when calculating the temperature rise at the time and place of exposure. Cells 506 can have different shapes and sizes. They may even be non-contiguous. They tile the area of past writing that can significantly contribute to proximity heating at the location for which the temperature is being computed. While cells need not be rectangular, the orthogonal nature of the scans suggests a basic cell structure that is rectangular and from which coarser cells and even non-rectangular cells can be constructed if needed. In the implementation illustrated, each basic cell has a length 512 (in units of pixels or beam scan lines) along the stage scan direction 330 (FIG. 3) which varies depending on proximity to the current beam scan, and each basic cell has a height 510 (in units of pixels) along the beam scan direction 320 (FIG. 3) which is the same everywhere. The cells to which kernel element pertain may be basic cells themselves, or aggregates of basic cells that can have any shape and may even consist of non-contiguous regions.

Associated with each cell in which the average dose is $C_i$, is contributed by the pattern being written, is a number $K_i$ in the kernel that describes the temperature rise at the current exposure point that would result from full exposure of all pixel sites within the cell. More particularly, in replacing individual pixels in equation 2 with cells we have greatly reduced the arithmetic magnitude of the task but the temperature at the current point of writing is as before computed by the linear superposition of temperatures:

$$T_j = 6_i K_i C_{ij} \qquad \text{Eq. 3.}$$

This is justified by the linearity of the diffusion equation.

The index i in $C_i$ and $K_i$ is really a spatially two dimensional index s,b covering the stage scan dimension s and the beam scan dimension b where s and b are relative to the current point of correction in the pattern for the $C_{s,b}$. However, in the interests of the greatest economy of computation with some computers such as microprocessors, s and b may not have simple ranges: there may be a complicated interdependence between them in the interests of avoiding computation of heating from cells that contribute insignificant heat to the current point of writing. In other types of computer such as digital signal processors it may not be advantageous to try to take advantage of this economy and may actually slow down the calculation.

For present purposes, it is easier to think of s,b as a simple index i that indexes a list of terms to be included which may explicitly reference s,b or do so implicitly in the code.

If the $C_i$ are normalized, full exposure of all pixels in the cell will result in $C_i=1$, in which case $K_i$ can be the actual temperature rise in degrees at the point of correction due to all pixels of cell i being fully exposed. It should be noted in passing that even if the pattern calls for full exposure of all the pixels of a cell indexed i and the $C_i$ are normalized, other corrections, such as that for backscattered electrons, may change $C_i$ to a value differing from 1, and to a value even greater than 1. In fact, the $C_i$ include all corrections that affect exposure, even that for heating itself. This is possible in raster scan machines because the beam scan is so fast that it outruns its own heat wave and the current beam scan does not significantly heat the resist where writing is currently taking place. (A small correction for this type heating due to neighboring pixels is discussed later). Thus, implementations of the present invention only determine, for example, proximity heating caused by beam scans that are earlier than the present beam scan. Since these are past events, the exact doses including the corrections for backscatter proximity correction and heating itself will be known and can thus be accounted for.

An aspect of an implementation of the present invention pertaining to high electron beam voltages is that it not only corrects for the effect of proximity heating on the direct exposure but also largely corrects for the effect of heating of resist in its response to backscattered electrons. This is true for two reasons: 1. The solution of the thermal diffusion equation based on an electron diffusion Monte Carlo derived heat source will include all electrons whether primary or secondary, whether forward of backscattered; 2. because the arrival of backscattered electrons is practically instantaneous with the direct exposure and because the heating due to past writing is diffused by the same mechanism as the electron diffusion that causes backscatter with additional thermal diffusion. Thus when the heating correction corrects the current direct exposure dose it also corrects the backscatter that direct exposure will cause. Thus, the effect of the heating correction both for the direct exposure as well as that for backscattered electrons is to make it appear to the backscatter correction processor that the exposure is taking place on a resist of constant temperature. While the temperature at the point of writing is not exactly constant over the backscatter region, and there is a second order effect due to the difference of direct heating of the resist by electrons in the intended exposure and the backscatter region, these have been shown not be large effects.

Returning to Equation 3, since the exact trajectory of the scan and order of pixel exposure is always the same in a raster scan system, the K values may be pre-calculated once and for all for use at any correction point along the beam scan, in increments of the basic cell height. In this way, run time thermal correction is possible. The cell boundaries and points for which the corrections are computed are selected in a way that requires only one set of K values needs to be stored for pure raster scan. In serpentine scanning, where the beam scans from top to bottom of the stage scan on one beam scan and from bottom to top on the next and so on, a few of the K values affected by recent beam scans in the direction opposite to the current beam scan are dependent on the position of the point of correction along the current beam scan and hence must be obtained from an array indexed the location of the current point of correction. However, most of the K values affected by all but the most recent scans are practically identical for serpentine and raster scanning and a fixed table of values may be used regardless of the location of the current point of correction.

The length 512 and height 510 of basic cells 506 (FIG. 5) are chosen to make the number of K elements tractable while at the same time preserving optimal accuracy. Were the actual pixel coverage within each cell to be full or uniform, the method of embodiments of this invention guarantees that the calculated temperature is exactly correct no matter how coarse the cell scheme. Error may arise because the method assumes that the coverage in each cell is uniform with the same value as the average, whereas in partly covered cells coverage may be non-uniform. Implementations of the invention find ways of constructing cells in a way that minimizes this error and brings it within tolerance while keeping the calculation within the capabilities of the selected processor.

Both the length 512 and height of a cell may vary according to their remoteness in space and time from the exposure point. To construct cells of height greater than 510, one groups them in integral multiples of the constant height 510. This has been found to be much simpler than making the height 510 variable, though doing so may be desirable in other implementations. This grading of cell size compensates for the large increase in contributing pixels as one looks further away from the exposure point, and allows for the number of cells to remain manageable.

The basic cell height 510 along the beam scan line 502 may be comparable to or somewhat larger than the scattering range of electrons in the substrate. This works even very near the exposure point 500, because the thermal input from past pattern detail is diffused by electron scattering and the centroid of the heat deposited by each flash may be 10–100 times deeper than the flash size. Thermal diffusion adds to the electron diffusion to blur fine pattern detail. At 50 kV writing on glass, it is reasonable to define the basic cell boundaries along 16–128 "bands" 108 (FIG. 5) each about 8–64 microns wide along the beam scan axis. Sixteen (16) may give large a but tolerable error. More than 64 or 128 bands may gain little accuracy but be costly in computing time better spent in other parts of the method. While the above numbers are typical, the number of bands across a stage scan depends on the beam voltage of the machine and the atomic composition and density of the substrate material, because the electron scattering range is so dependent and the depth of energy deposition and hence also thermal diffusion is so dependent. The thermal conductivity also influences this parameter. For example, glass and sapphire are made of chemical elements that have similar atomic constants but sapphire is a much better thermal conductor than glass.

One way the determine the number of basic bands in the beam scan direction is to divide the stage scan in the beam scan direction into such a large number of bands that the band height in the scan direction is much smaller than the electron diffusion length in the substrate, then compute the resulting basic kernel elements. If adjacent bands of recent scan lines contribute similar temperatures, the bands are unnecessarily narrow and coarser bands can be used. Hard and fast rules cannot be given to determine an optimal cell structure because the final choice will depend on the error budget of the lithographic machine and the speed and type of resist heating processor that will be used. Prudent design will consider various options to find one that strikes the best balance between conflicting requirements.

Figure 6A:
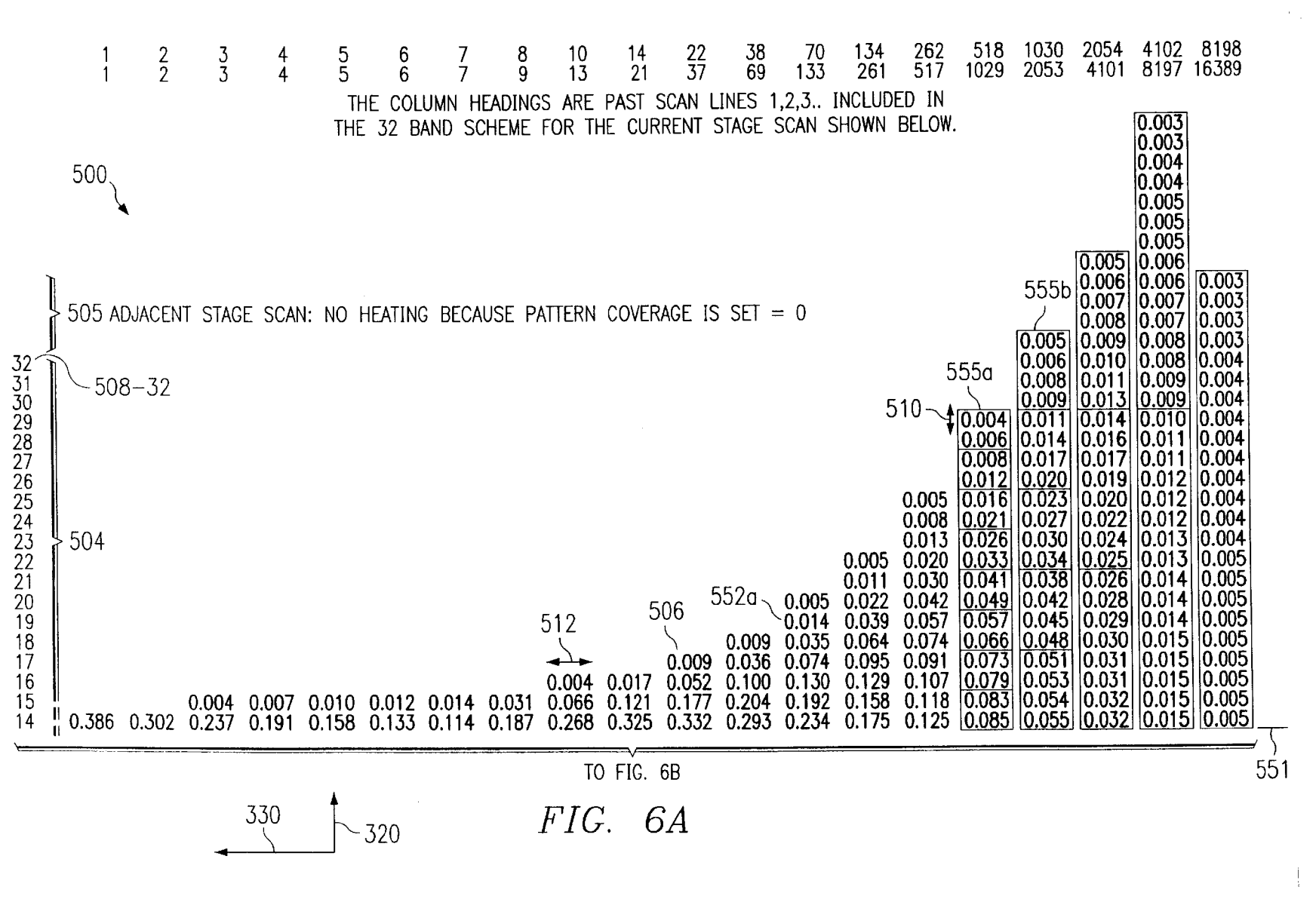
Figure 6B:
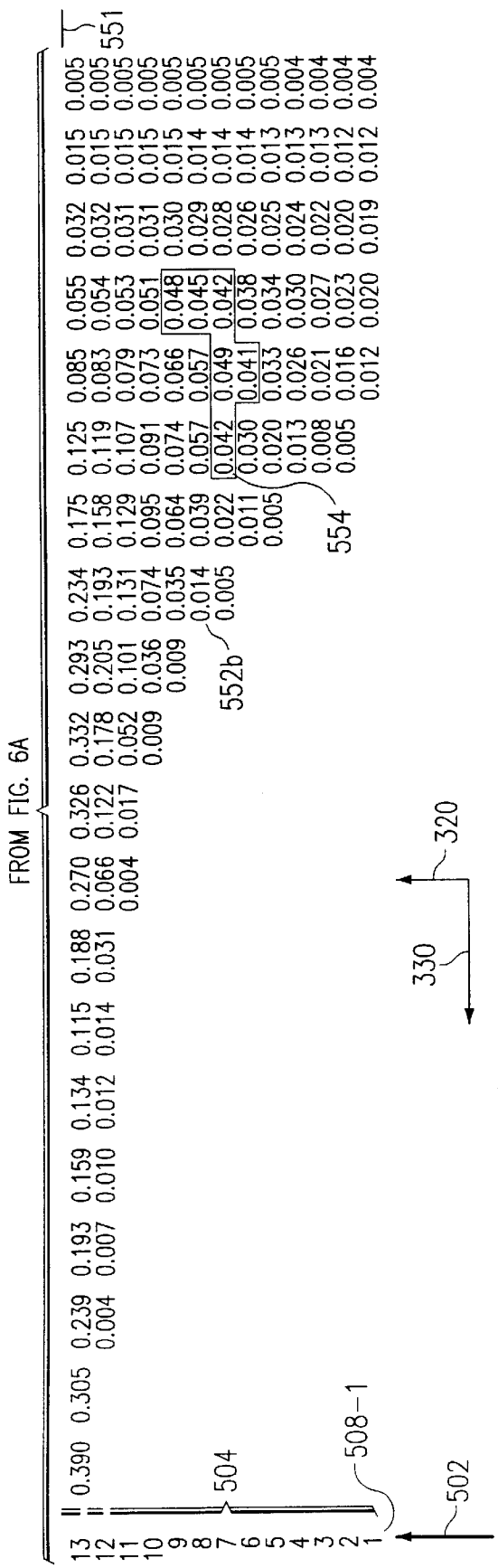

FIG. 6A and FIG. 6B ("FIG. 6") illustrate a basic cell kernel in greater detail. As will be explained in greater detail below, shown is a current beam scan 502, a current stage scan 504, a plurality of basic cells 506, and a plurality of bands 508-1 through 508-32. The column headings represent the beam scan line numbers included in the particular cell (i.e., represent the cell length). If scan line 0 is the current beam scan, 1 is the immediately preceding and so on into the past. The numbers for each cell in this kernel are the temperatures that would result if all the pixels in the corresponding cell received a full nominal exposure. The cell coverages which generally fill the entire stage scan are not shown in FIG. 6: These will vary from pattern to pattern, and hence along the stage scan, but the kernel is a fixed set of numbers in raster scan independent of the location of the point of correction in the beam scan direction, shown as between bands 13 and 14 in the example of FIG. 6, and independent of the location of the current beam scan along the stage scan.

Referring to FIG. 5, the length of a cell along the stage motion axis 330 and the height of the cell in the beam scan direction 320 are chosen so that the kernel value of K for its cell is as independent as possible of the distribution of exposure within the cell, while keeping the number of kernel terms manageable. A second guiding principle for minimization of the number of cells is that the cell size and shape be chosen so that each cell contributes a similar temperature at the correction point. This rule can be relaxed at the kernel edges where the contributions necessarily fall to zero.

More particularly, as shown, the length 512 (FIG. 5, FIG. 6) of a cell in the stage scan direction 330 can increase as its distance from the exposure point increases. For example, at typical raster scan exposure rates, cell lengths may vary from one pixel wide, that is one beam scan line wide, (approx. 0.1 um) for several beam scan lines near the current scan line, to several thousand pixels (100 um to 1 mm) wide far from the exposure point. Substrate heating from adjacent pixels along the same scan line 502 for which corrections are being computed is negligible because the raster scan beam moves faster than heat propagates. This means that heating correction using a method of embodiments of this invention need only take into account past beam scans. This is an important property of raster scan because it makes it possible to include as input pixel data to the heating correction scheme only the data from completed beam scans that have already been corrected for heating. Thus raster scan heating correction includes its own effect without the need for iteration or accounting for higher order terms.

To further reduce the number of cells, it is possible to allow the height of cells far from the exposure point to cover several basic cell bands in the beam scan dimension. To further limit the number of kernel elements, they need only be located in regions where the total heat contribution is significant: whether this economy is desirable depends on the processor in use as discussed earlier. It may be useful to effect this economy of calculation with a microprocessor but perhaps not with a DSP (digital signal processor). This economy creates a boundary to the kernel outside of which there are no K elements. Because this boundary generally has no simple geometry, the ranges of the indices s and b mentioned earlier have no simple rule. As a consequence, at any point for which corrections are being computed, for each kernel element there is a corresponding cell, but the converse is not true. At each correction point there will be many cells for which there is no corresponding kernel element: this can be a considerable economy with some types of processor. The white space in FIG. 6 is an example.

In operation, as the beam scans from one edge of the stage scan to the other, the kernel scheme scrolls over the cell scheme. Eventually each cell in the cell array is included in the calculations when non zero kernel elements scroll over it.

Each new beam scan 102 (FIG. 6) corresponds to a scrolling of the kernel scheme in the stage scan 330 direction. This requires updating the scan line membership of each cell before starting calculations for the next beam scan, a process which is facilitated with binary machines if the number of scan lines per cell is a power of 2, simplifying the normalization of cells. An example of scan line counts per cell in the stage scan dimension going from the scan line immediately preceding the current into the remote past is:

$$1,1,1,1,1,2,2,4,4,8,8,16,16, \ldots 4096,4096.$$

A factor of two economy in kernel elements and hence processor multiplications is possible if the points of correction are chosen on basic cell boundaries in the beam scan direction 320 because of a resulting high degree of symmetry in the kernel scheme: The common kernel element is factored out of terms of the form:

$$K \square C_p + K \square C_q = K \square (C_p + C_q),$$

saving a multiplication for each pair or terms. FIG. 6 shows how this is possible. In particular, the kernel is very nearly symmetric about the axis 551. Thus, the kernel value may be factored out such that a multiplication is required only for the "bold" values 552a of the non-bold values 552b.

A typical grouping in the stage scan direction 330 may be to have cells contain only one scan line for several scan lines back from the current scan 502 for which corrections are being computed and then to have the number of scan lines per cell increase roughly exponentially into the more remote past. Starting to group scan lines together prematurely in constructing the C elements has been shown to result in inaccuracy because the most recent scan lines are the most significant contributors to heating and their contributions decline rapidly into the past. After computing a FIG. 6 type kernel one can adjust the cell boundaries if necessary more accurately to meet the guide rules given above.

In the beam scan direction 320, we use the chosen number of bands, say 32 in the example of FIG. 6, for all the scans that lie within the electron scattering range of the current beam scan line 502. In this example, if the scan lines are 0.1 microns apart and the scattering radius 10 microns, we will have one band per cell for at least 100 scan lines preceding the current. Then we may use 2 bands per cell, then 4, then 8 and eventually 16 for the most remote cells as illustrated by the shaded regions of FIG. 6. These are rough rules of thumb to devise a first approximation to the cell structure. For a proposed grouping of beam scan lines into cells in the stage scan direction 330, instead of trying to guess an optimal grouping in the beam scan direction 320, it may be advantageous to compute the basic kernel without any grouping of bands and then to determine the optimal band grouping by inspection.

FIG. 6 is an example of a kernel scheme for raster scan computed for the stage scan divided into 32 bands numbered in the column on the left. The scan lines included in the cells of each column are shown in the column headings. 1 is the just completed scan, 2 the scan before it and so on. The numbers of scan lines included each column of cells in this example are respectively:

1,1,1,1,1,1,1,2,4,8,16,32, . . . 8192. This scheme was computed for a cell system assumed to be normalized, so that the numbers shown are actual degrees rise in temperature that full exposure of all pixels in each basic cell would contribute at the point of correction 100 (which in this example is on beam scan 0 at the boundary between cell band 13 and band 14).

Kernel elements can be computed for some assumed nominal exposure dose, say 20 $\mu C/cm^2$, and scaled linearly if the resist in use has a different speed. However, it is important to understand that generally there are no other simple scaling rules: Kernels cannot be scaled for other parametric changes such as beam scan length, scan repetition period and so on: Any such change requires a complete recomputation of the kernel.

Because FIG. 6 was computed for correction points on band boundaries, only the numbers shown in bold need be stored because of the high degree of evident symmetry. (Because the kernel is slightly asymmetric, final kernels should use the arithmetic means of pairs of kernel elements that are symmetrically related.) The scheme of FIG. 6 was computed without aggregating cells in the beam scan direction 320, i.e. it is the basic kernel scheme showing the temperature contributions of basic cells of a uniform band system. However the shaded blocks show how such an aggregation in the scan direction 320 may be accomplished because each block has approximately equal kernel values in each band 508. Thus, for example, the two bands of block 555a may be aggregated and the four bands of 555b may be aggregated because adjacent bands contribute temperatures that differ by only a few thousandths of a degree in this example. Whether it is better to aggregate these cells in storage or to factor the common K value out of each block during the calculation is a decision left to the programmer implementing the scheme who will be able to decide which is more efficient with the processor at hand.

In the example of FIG. 6, basic cell kernel elements have been omitted for band cells which contribute less than about 0.003 degrees in temperature rise at the point of correction. This results in a small but computable underestimation of the temperature at the correction point. Aggregation of cells may also be accomplished across both the stage and beam scan directions. Thus, block 554 crosses several cells in both directions. Such aggregations may be used if the kernel values of the basic cells in the aggregation are relatively close to one another. It is not even necessary for the basic cells to be contiguous when they are included in a larger cell.

The economies of omitting small kernel terms and grouping multiple bands 508 in the beam scan direction 320 as well as scan lines in the stage scan direction 330 may be advantageous with certain types of processor such as microprocessors. With processors designed to perform scalar products very rapidly, such as DSPs (Digital Signal Processors) these "economies" may be yield no advantage or even slow the calculation speed. For this reason we do not propose hard and fast rules for the cell scheme but suggest various approaches of optimizing accuracy within the constraints of the available time to do corrections in real time. For example when grouping bands by factoring out a nearly constant kernel element.

$$K_i \square (\ldots\ C_{i-2} + C_{i-1} + C_i + C_{i+1} + C_{i+2},\ \ldots)$$

can be done in two ways: 1. The C terms can be left ungrouped as basic cells in the beam scan direction in the C storage and summed in the dot scalar product calculation, as shown by the shaded areas (e.g., 555) of FIG. 6. Note that the resulting composite cell need not be rectangular as is shown by the irregularly shaped area 554 in FIG. 6. Alternatively: 2. We can sum the terms when we update the C memory after each beam scan and store only one C number which represents the aggregation. If we make the latter choice, we cannot take advantage of the kernel being independent of the position of the point of correction: we must store a separate kernel for each correction point which, however, is not a serious burden. The kernels for each correction point can be obtained from a basic cell diagram like FIG. 6 by removing from it the shading and scrolling it over a map of storage which shows how we have chosen to aggregate the cells in memory: For each correction point we can read the band contributors in FIG. 6 type diagram to the cells in the storage map containing them.

Certain processor types may benefit from one choice, others from the other choice and there may be processors for which do not benefit at all from aggregation of cells in the beam scan direction. However, aggregation of writing pixels into bands and having cells in each band contain groups of scan lines appears imperative with any present day processor if the correction is to be computed in real time.

Writing in adjacent stage scans 505 if any, is explicitly ignored in the scheme because the time lapse since it occurred is great enough to make its temperature contributions insignificant, or accountable by the global heating processor, if such a processor is included in the lithography machine. FIG. 6 shows kernel elements overlapping into the adjacent stage scan 505. Where this overlap occurs, kernel elements there must either be ignored during the calculation, or C cells provided in storage corresponding to the two adjacent stage scans, which cells however are permanently set to zero. However, all significant kernel elements must be present in the kernel if for some correction point they can be within the current stage scan.

The temperature of the mask blank will gradually rise a few degrees on a time scale of many minutes or hours as writing proceeds. Advanced machines are likely to be equipped with a special processors or sensors to determine this temperature for the purpose determining of mask blank thermal expansion. This temperature rise, referred to as global heating above, if available at the current point of writing, should be added to the temperature rise computed by methods according to embodiments of this invention.

Figure 7A:
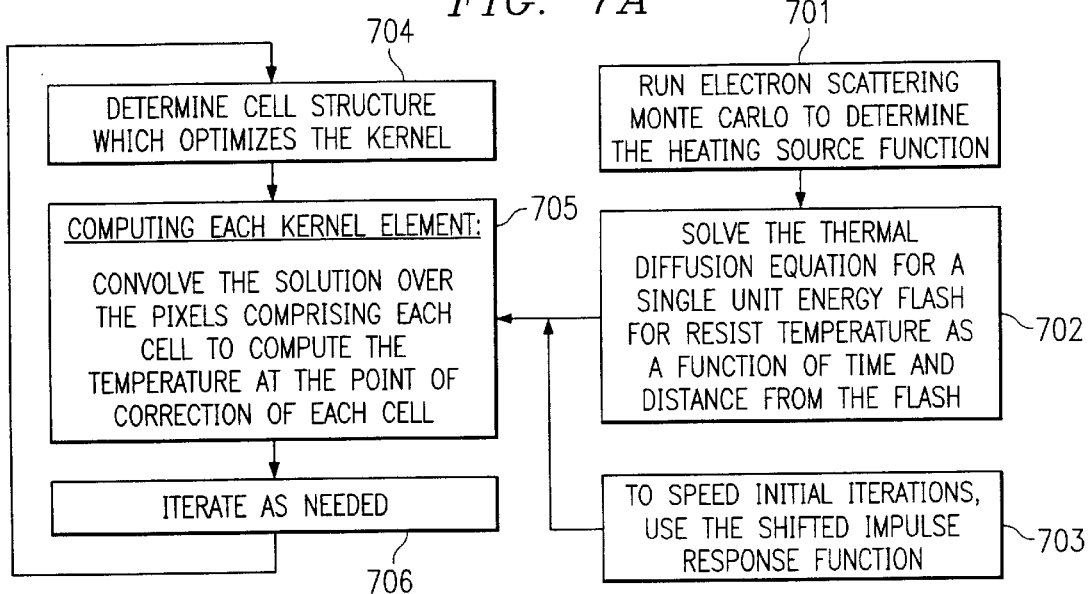
FIG. 7A and FIG. 7B are flowcharts illustrating operation of an implementation of the invention.
Figure 7B:
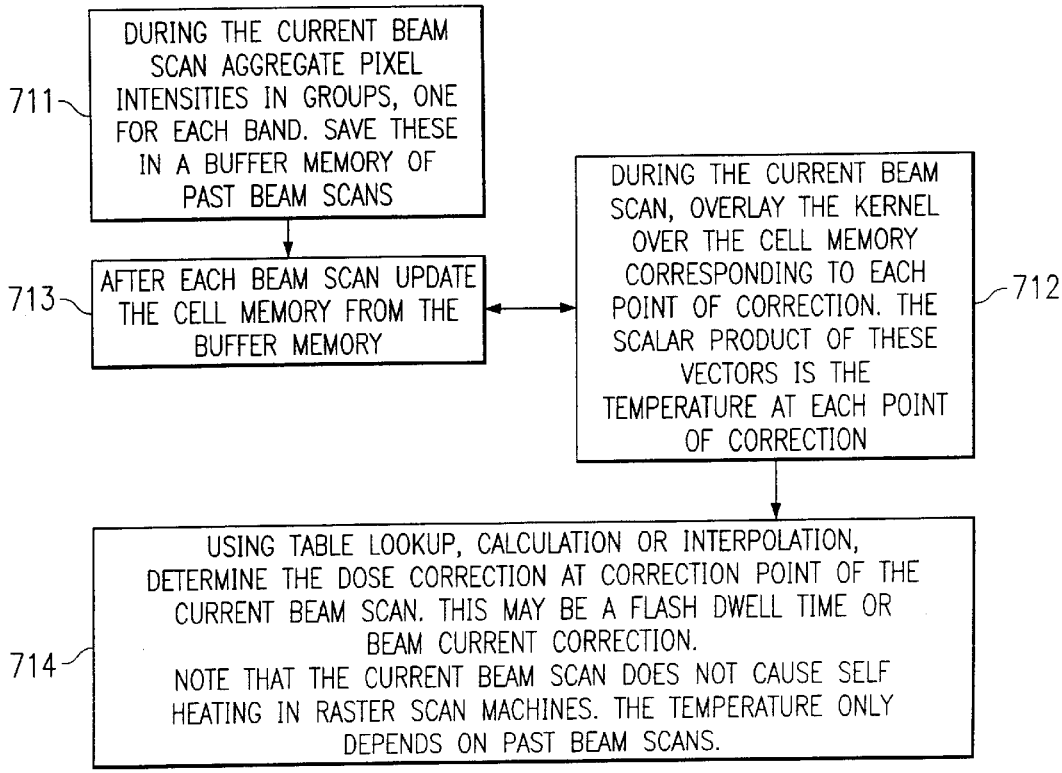

FIGS. 7A and 7B illustrate operation of a method according to an implementation of the invention in greater detail. Turning now to FIG. 7A, a flowchart illustrating the determination of the cell structure and kernel for a given writing strategy is shown. For the chosen beam voltage and substrate material an electron scattering Monte Carlo simulation is run (701) to determine the thermal source function heat distribution in the substrate of a single flash. This is scaled to a flash of unit energy (say, 1 microjoule). The thermal diffusion equation (702) is solved using the above source function. The following approximations and shortcuts may be found to give adequate accuracy: Ignore the resist and mask layers in the thermal calculations or use typical parameters for them. These layers are usually very thin. Assume rotational symmetry of the flash provided it is small compared to the range of electron diffusion in the substrate, which allows the problem to be solved in two rather than three spatial coordinates. Assume writing on an infinite laminar substrate, i.e. ignore edge boundary conditions.

The surface temperature solution is then tabulated as a function of time and radial distance from the flash. Numerical solution of the diffusion equation is expedited if logarithmic radial, linear depth, cylindrical coordinates are used. The logarithmic radial coordinate requires special treatment for r near zero however. Special functions may be needed to interpolate in the tabulated solution unless a very fine step intervals are used.

A shifted impulse response function 703 (described below) may be used for initial trials and otherwise at large distances and times provided its two disposable parameters have been determined to give a good fit to the exact solution. In 704, the number of bands in the beam scan direction 320 (FIG. 6) is selected by dividing the beam scan length by the electron diffusion range to determine the band width and hence the number of bands per scan. For computational convenience with binary machines this may be rounded to the next higher power of 2. Assuming unit coverage of each pixel in each band and scan line, the temperature for pure raster scan is computed (705). This is independent of the location of the point of correction modulo one band width. Computing it for the boundary between two bands will result in a very nearly symmetric kernel. The sum of the array is the temperature at the chosen correction point assuming unity coverage of all past writing. Writing the test code so that the temperature is displayed as the calculation is carried to scan lines in the arbitrarily distant past will allow the asymptotic temperature to be found. This can be repeated for various coverage scenarios. For the proposed coarse cells scheme, the temperature is computed simulating the real time processor the same coverage scenarios. If the errors are out of a predetermined tolerance range, the coarse cell structure may be changed accordingly repeating 704, and 705. Unnecessarily high accuracy may suggest a coarser structure, a more economical processor, or both.

FIG. 7B illustrates the real time calculation of temperature at the point of writing and the modification of dose to compensate for substrate heating. In 711, for every currently written scan line, the pixels written are aggregated for each band by a high speed adder (not shown). For example if there are 8192 pixels/scan and 32 bands the pixels are summed in groups of 8192/32=256. For convenience one may design this adder so that its output is 1.000 at some binary scale if all pixels in the group were written at full nominal dose. These numbers may be loaded into a two dimensional circular buffer (FIG. 8, described in greater detail below) of 33 cells. in the scan direction in this example and 8192 or 16384 or some such high power of 2 in the stage scan direction, depending on the cell structure as determined in FIG. 7A.

After each scan is completed, the stage scan index in this array (FIG. 8) is decremented by 1 so values higher than the current modulo the buffer size correspond to past scan lines (713). Because the stage scan pointer into this buffer is circular, scan lines older than 16384 beyond the present will be overwritten by the next scan. In 712, concurrently or somewhat ahead of the accumulation of pixels in the current scan, the temperature is computed by overlaying the kernel over the coarse cell map designed in FIG. 7A and the temperature is computed by the real time processor 422 (FIG. 4) by taking the scalar product of the kernel and the cells of the coarse cell map for the current point of correction which is typically at a point on the band boundaries. The responsibility of the substrate heating processor 422 (FIG. 4) of embodiments of the present invention is to compute the temperature at selected points along the current beam scan.

In 714, this number may be sent to a second much faster processor (e.g., 428 in FIG. 4) in the data path of the machine which looks up in a table the actual dose for every pixel given the pattern requested dose, the amount of backscatter from the backscatter computer 418 (FIG. 4), the temperature at the band boundary and possibly other factors that affect the dose. Because this processor can also be supplied the pixel number it can in principle interpolate the temperature of the current pixel form its position between band boundaries. The table loaded into the memory of this processor is precomputed for the resist in use to account for its sensitivity to temperature and even non-linearity in this sensitivity if necessary.

As noted in FIG. 7B, the above events may take place in time arbitrarily earlier than the actual writing provided the computed pixel doses are not further modified before they are written. After all of the pixels in the current scan line have been accumulated in the buffer of 711, the coarse cell memory in 712 is updated from all of the data in 711. The method of doing this will be evident from the buffer structures and their contents to those skilled in computer programming. The kernel convolution described above is done with the data of the 712 memory.

Implementation Aspects

The value of K within a cell specifies the temperature contribution from that cell if all of its component pixels were exposed, assuming normalized cells. If the cells are not normalized, the normalizing factors can be carried in the K but this will generally require a floating point processor. During the actual writing, the actual thermal contribution of a cell to the temperature at the correction point is its value K multiplied by the average measure of deposited energy. As noted above, the temperature is evaluated with the convolution:

$$T_j = \delta_i K_i C_{ij} \qquad \text{Eq. 3.}$$

which is evaluated in real time, where $C_{i,j}$ is the fractional pattern coverage after various corrections have been applied. Writing i as a double index s,b mentioned earlier, the shorthand $C_{i,j}$ would be written $C_{s,b+j}$. When j advances, the kernel advances relative to the cells one band in the beam scan direction. i runs over the same kernel elements $K_{s,b}$ (in raster scan) but a different set of the $C_{s,b+j}$ because j has advanced. To calculate corrections on band boundaries along the scan, the position of the exposure site j with respect to the kernel is changed. Unexposed areas outside the scan field are represented by zero pattern coverage $C_{i,j}=0$. This is allowed because the heating from pattern exposed in adjacent stage scan stripes effectively dissipates before the next stripe is exposed as described earlier. This allows the same set of pre-calculated K values to be applied everywhere within the scan field in raster scan, hence the absence of an index j on the K terms, if we have not aggregated basic cells in the beam scan direction. However, in serpentine scanning a different set of K values are needed for each value of j in principle. In practice they are only needed for a few of the most recent odd numbered past scan lines, for example line 1 and possibly lines 3 and 5 in FIG. 6. The rest of the kernel is indistinguishable between raster and serpentine scanning.

If, for example, a 32 band scheme is used as in FIG. 6 and the kernel was computed for points of corrections on band boundaries to take advantage of the kernel symmetry, the index j=0 may correspond to the bottom of the stage stripe and j=32 to the top of the stage stripe so that 33 temperatures would be computed for each beam scan. The corrections dependent on these temperatures could be applied to every pixel between band centers bracketing the point of correction or, if sufficient computational power were available and the corrections computed somewhat in advance of writing, the temperatures or corrections dependent on them could be interpolated for each pixel.

To avoid undesirable cross terms and higher order effects in the heating correction, it is important to apply the heating correction to data that has already been corrected for scattering proximity effects. Because of diffuseness of heating, a correction needed for a pixel will also largely correct for the backscatter it causes. Thus we can effectively assign to the heating correction processor 422 (FIG. 4) the task of making it appear to the proximity backscatter corrected data that writing is occurring on a resist of constant thermal sensitivity, or what amounts to the same thing, that there appears to be no proximity heating. The pixel data used to compute the heating correction should include all corrections including proximity resist heating itself. This is possible in high voltage raster scan lithography as was pointed out earlier, because the current beam scan does not self heat. Her ice the heating correction compensates for only for writing that has already occurred in past beam scans and not on what is currently being written.

The total exposure dose and heat delivered to each pixel both depend upon the product of beam current times exposure time, so the dose correction for proximity heating may be applied by either modulating the beam current or modulating the time that each pixel is exposed.

The last step sums the contributions $K_j \square C_{ij}$ from all cells covered by kernel elements to obtain the temperature for each j point of correction, assuming that there is a point of correction for each band. The corrections could be computed less frequently if the processor 422 (FIG. 4) is pressed for time at the expense of not following pattern induced temperature fluctuations accurately. The corrections could be computed more frequently, for example both on band boundaries and at band centers at the expense of storing a set of kernel elements for each. The temperature is then passed to a lookup table 428 (FIG. 4) with individual pixel dose as address data to output the correct pixel dose. The lookup table contents are computed from data of experimental origin that reflects the resist thermal sensitivity characteristics. The computation may include non-convolutional cross terms with proximity backscatter correction and direct heating effects. The summation to get the temperature is done on a microsecond time scale whereas the summation of writing pixels into cells in the beam scan direction and likewise the table lookup has to be done on a pixel by pixel basis and hence possibly on a nanosecond time scale which may require these operations to be done on separate pieces of hardware.

Constructing and Updating the Cell Storage C

The method of initializing the cell memory from pixel data assumed summed into the cell components for each completed beam scan will be evident to those with ordinary skills in the programming arts. The following description of ways of accomplishing this is given by way of example only:

The main challenge is the determination of the coverage within cells from the original data. A simple implementation is to load the current beam scan after it has been aggregated into cells in the beam scan dimension into a two dimensional circular buffer B. A pointer into such a buffer B, which indicates the location of the current beam scan in the stage scan dimension, is then decremented ready to receive the cells of the next beam scan. The buffer B should be large enough in the stage scan dimension to contain every scan line represented in a cell memory C.

Only the preceding millimeter, typically, of the present stage scan needs to be carried in the C array. At the start of each new stage scan this array is cleared. If a fault occurs during the stage scan and writing must be suspended, it is necessary for heating correction purposes to introduce a forced delay of some fixed time, typically less than a second, to allow the resist to cool; the C array is then cleared and writing resumes as in a new stage scan. Such faults may be caused by data flow overloading the pattern data path computer: typically they are rare in well engineered machines.

Figure 1A:
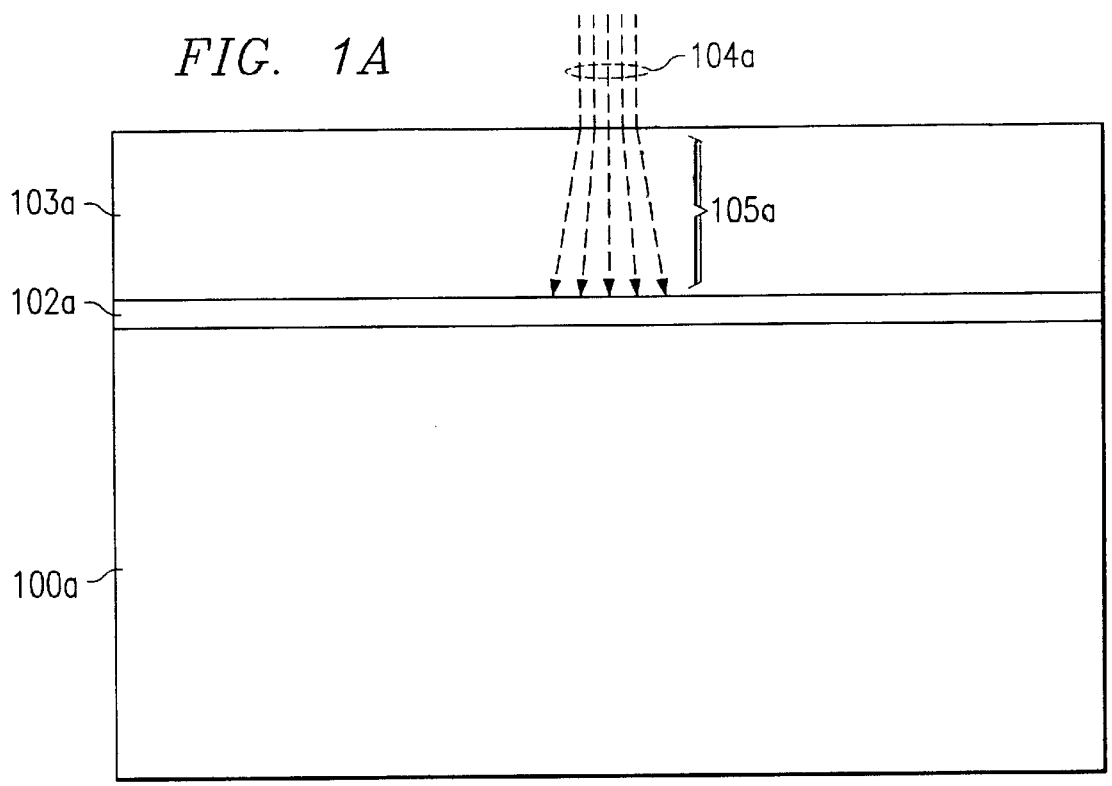
FIG. 1A is a schematic cross sectional view of low energy e-beam impact on substrate, mask to be etched and resist.
Figure 1B:
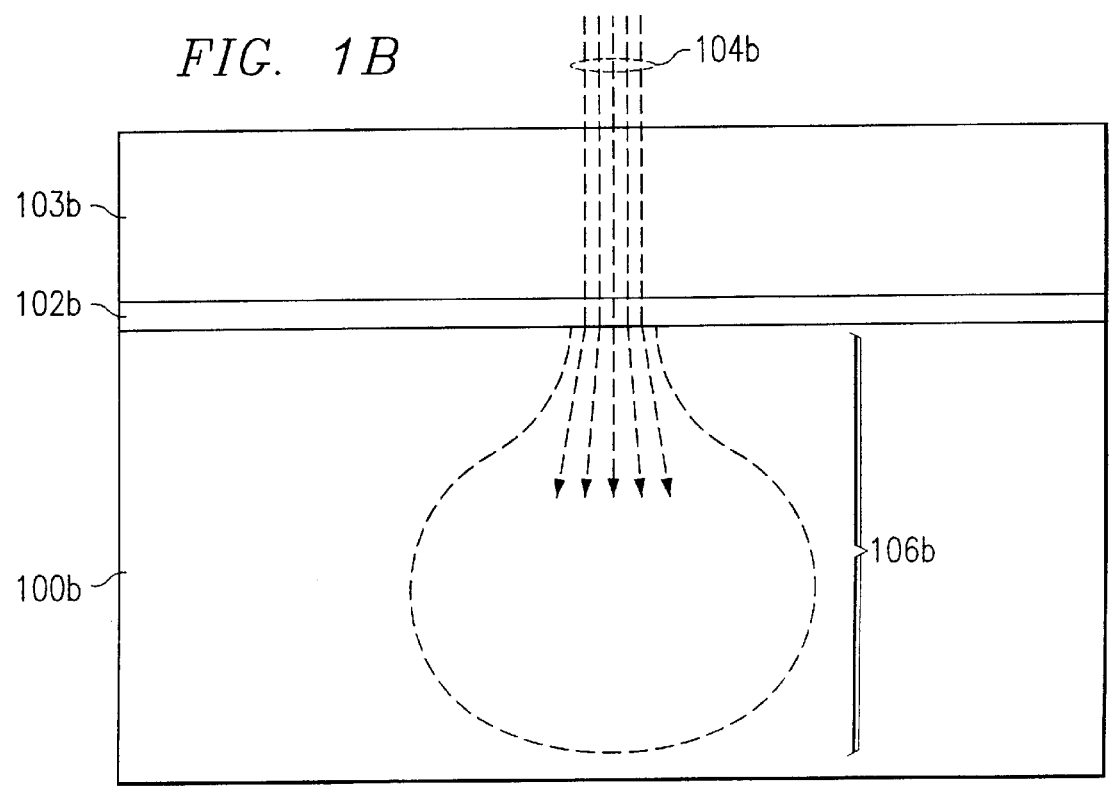
FIG. 1B is a schematic cross sectional view of high energy e-beam impact on substrate, mask to be etched and resist.
Figure 2:
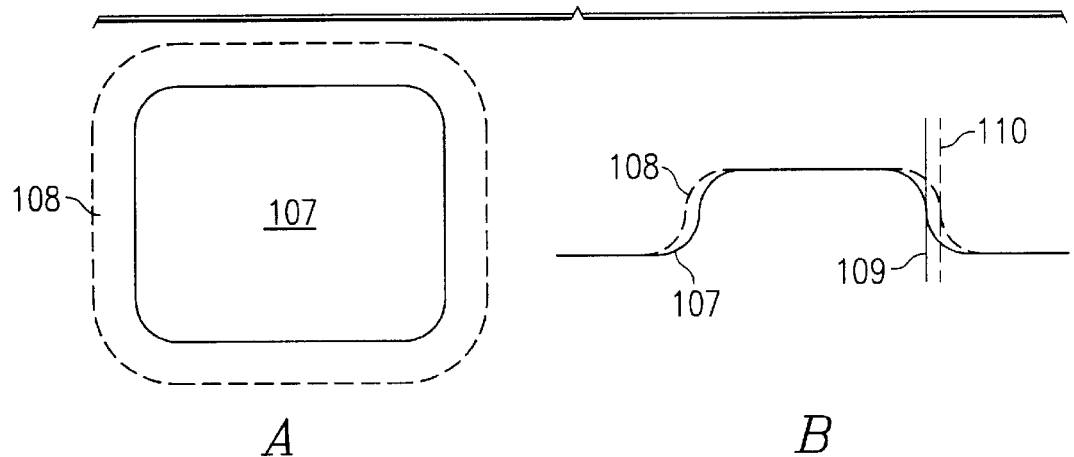
FIG. 2A and FIG. 2B are schematic top view and side views, respectively, of regions of exposed resist depicting pattern blooming by overexposure.
Figure 8:
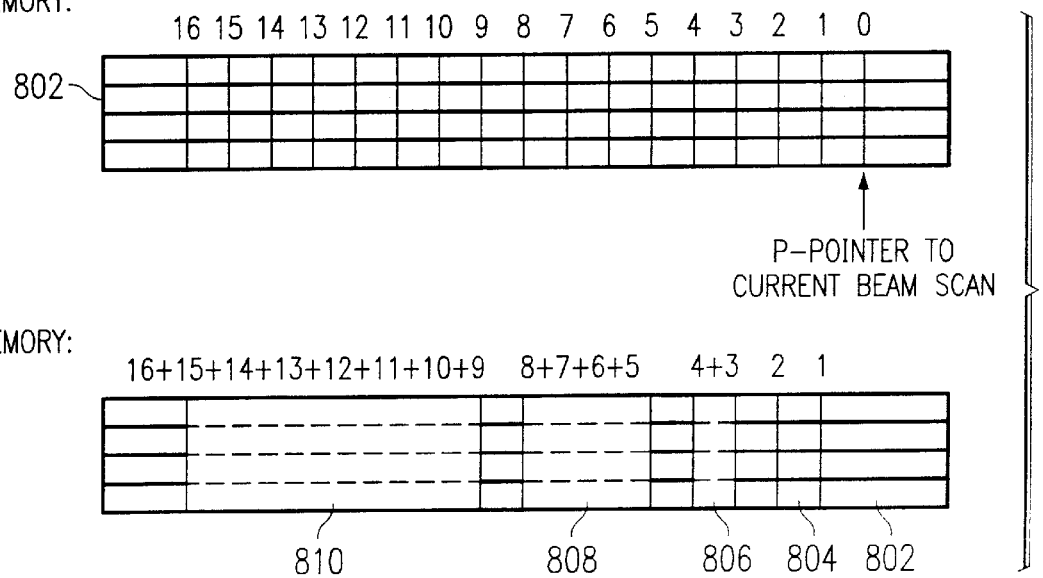
FIG. 8 is a diagram illustrating exemplary scan line and cell and kernel memories according to an implementation of the invention.

More particularly, such a cell memory C and circular buffer B are illustrated in FIG. 8. The B memory is a two dimensioned array with a cell for each band in the beam scan dimension and as many past scan lines as need to be stored in the stage scan direction for which the current pointer value is p. Then (p+n) mod b points at the $n^{th}$ past scan line. While the circular buffer B typically may contain 8192 or 16384 past scan lines and typically 32 or 64 bands, FIG. 8 depicts sixteen (16) past scan lines 800 and four (4) bands 802 for clarity. Further, as shown, the C memory also has as many cells in the beam scan direction as the B memory but aggregates them into five arrays 802, 804, 806, 808, and 810. Array 802 stores the scan 1; array 804 stores the scan line 2; array 806 stores the scan lines 3 and 4; array 808 stores the scan lines 5, 6, 7, and 8; and array 810 stores the scan lines 9, 10, 11, 12, 13, 14, 15, and 16. After the pixels in each band of the current scan line have been summed, the sum is stored in the current band of the current scan line 0. In practice there may be 128 or 256 pixels summed in the scan direction in each band. This summation may require a specialized piece of digital or analog/digital hardware.

After each beam scan, the pointer p into B memory is advanced and the C memory is updated from the B buffer. This makes the current scan 0 in B memory the new scan line 1,1 becomes 2 etc. New scan lines 1 and 2 in the above diagram simply replace 1 and 2 in C memory. The next array 806 in C memory contains the old scan lines 3 and 4. The new scan line 3 is added cell by cell in the band direction and the old scan line 4, now scan 5, in B memory is subtracted. Likewise in the next array of the C buffer 808, which contains the sums in each band of scan lines 5, 6, 7 and 8, the new scan line 5 is added and the old scan line 8, now scan line 9, is retired by subtraction.

It is not essential that the C blocks contain powers of 2 numbers of scan lines but normalization is simplified if they do. In binary machines the C blocks thus can be kept normalized so that they contain numbers between 0 and 1 where 1 represents full coverage in the block for each band. The corresponding kernel element K can then be the actual temperature rise at the point of writing due to full coverage in that band and block.

The B and C memories are initialized to zeros at the start of each stage scan because we ignore heating contributions from the adjacent scan in this invention. This is justified because the time needed to mechanically move the stage between stage stripes is long enough to allow heat to dissipate before new writing commences. The aggregation of scan lines into cells in the stage scan dimension is then automatic in C if one adds into each cell the beam scan line element arriving in that cell from the B memory and one subtracts out, also from the B memory, the beam scan line leaving that cell, with appropriate normalization. The way the cells are aggregated in the stage scan dimension may be arbitrary. However, a power of 2 aggregation makes normalization of the cells fast and making b a power of 2 makes the calculation of (p+n) mod b fast on binary machines by avoiding the usually slow divide operation. While the B memory only requires a few Mbytes, it may be beyond the capacity of certain types of machine such as Field Programmable Gate Arrays (FPGA). It will be evident to those with ordinary skills in the programming arts that the B memory can be avoided and the C memory updated from itself at the expense of the updating of large cells less frequently than small or by updating after each beam scan but by using weighted mean from one cell to update the next. This will introduce error, which can be analyzed however, and which may be within tolerance for the machine at hand.

Memory C as depicted in FIG. 8 represents the current stage scan only. However the kernel will generally overlap into adjacent stage scans. The overlapping kernel cells must either be ignored in the calculation or if they are included, dummy C memories must be included for the adjacent stage scans which memories however must permanently be set to 0: This is equivalent to providing bands of zeroed cells in the overlap regions of a single C memory.

Embodiments of the present invention ignore heating from pixels in the same beam scan for which we are computing corrections. This is justified for conduction of heat through the deep substrate because the beam outruns this heat in raster scan. However some proximity heating may arise from the immediately adjacent pixels to the one being written by thermal conduction of heat through the resist, masking layer and the superficial part of the substrate. This heating can be computed a priori with suitable modeling software or modeled experimentally and a correction applied to the current pixel dose by lookup in a precomputed table. This correction typically must be done by a separate machine on a much faster time scale than the calculations of embodiments of this invention. However, this fast machine can be used to implement both corrections: the temperature from the proximity heating computer which changes relatively slowly, the proximate pixel doses and the required dose corrected for proximity backscatter may all supply bits to an address bus that looks up the resulting precomputed dose for the current pixel. This pre-computation will take into account the thermal sensitivity of the resist in use.

The current pixel doses which include all corrections are summed or averaged into cells for each band in the vector of the B memory referred to above that contains the current beam scan. When the current beam scan is completed and the pointer to the current scan line in B memory decremented, the current scan will become scan line 1 in FIG. 5 and will enter into calculations of the temperature for the next scan line.

Calibration of Resist

As discussed above, once the temperature rise at the point of exposure is calculated, the appropriate dose correction may be applied because the relationship between resist sensitivity and temperature during exposure is known for the resist in use. The correction calibration for a particular resist is obtained from experimental data taken under controlled conditions that account for temperature rise due to direct resist heating during the pixel exposure as well as proximity heating from previously exposed patterns. These proximity temperatures in this type of calibration experiment can be calculated by exactly the same method described here and the dose compensation of target exposures experimentally determined to make the exposure independent of temperature rise. This method of calibrating resists has the merit of yielding $\omega(dose)/\omega(temperature)$ under the conditions of actual lithography which includes the effect of resist direct resist heating due to the electrons that expose the resist.

One way to calibrate new resists on a machine equipped with resist heating correction described herein is to write a series of identical stage stripes except that each would be written with a different trial $\omega(dose)/\omega(temperature)$ coefficient.

Figure 9A:
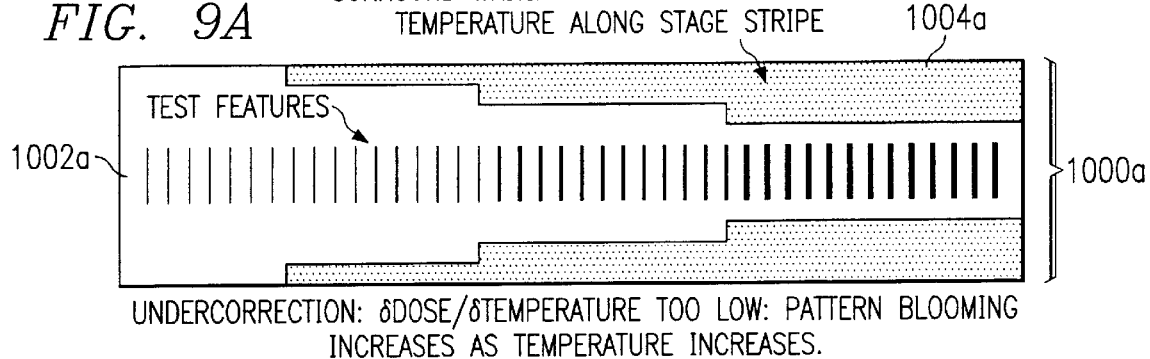
FIG. 9A–FIG. 9C illustrate resist-temperature calibration according to an implementation of the invention.
Figure 9B:
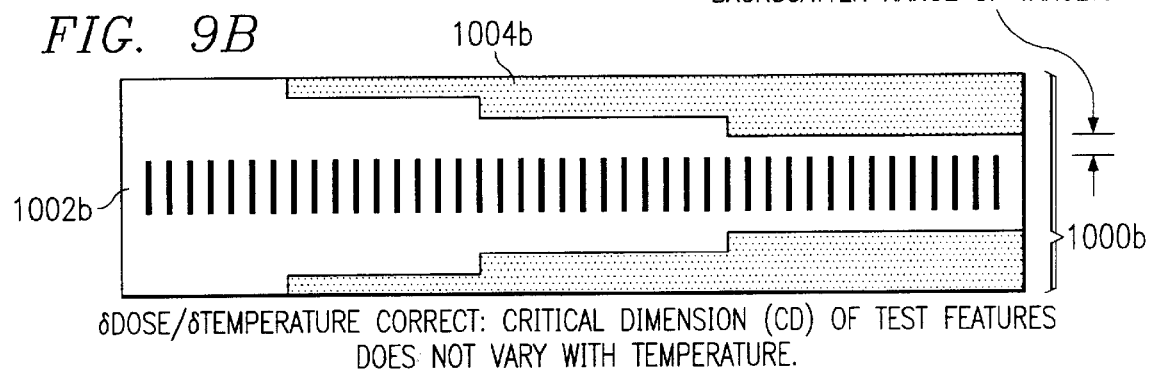
Figure 9C:
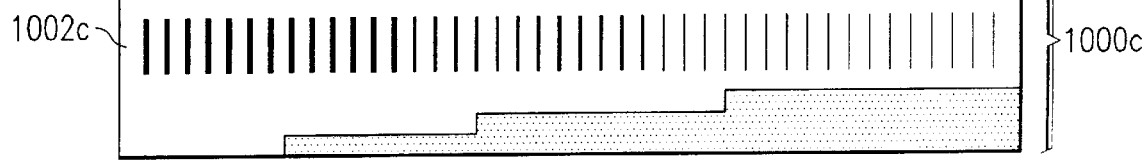

For example, FIGS. 9A–9C illustrate stage stripes 1000a–1000c. Down the center of each stage stripe is a set of test features 1002a (FIG. 9A), 1002b (FIG. 9B), 1002c (FIG. 9C). The test features are sets of identical small features with a machine measurable critical dimension (CD) written down the center of the stage stripe 1000. On each side of this series, and out of backscatter range, is increasingly dense writing 1004a–1004c designed to produce a progressive temperature rise at the CD targets 1002 from 0 to the maximum. The value of $\omega(dose)/\omega(temperature)$ giving the most constant measured CD would be the most nearly correct value for that resist.

More particularly, a correctly calibrated resist is shown in FIG. 9B. The CD features 1002b are uniform across the scan. FIG. 9A's stage stripe 1000a is undercorrected, because the test features are thicker in the direction of denser writing; the stage stripe 1000b of FIG. 9C are overcorrected, because the test features are thicker in the direction of less dense writing.

It is noted that this is a null experiment because we are trying to drive CD variation to zero. To make CD more sensitive to temperature induced equivalent dose error, we can put the machine somewhat out of focus to increase $\omega CD/\omega dose$ in the equation:

$$T(°K) = H[2a/(\Lambda + t)^{3/2}]\exp[-b(r^2 + \Gamma^2)/(\Lambda + t)] \quad \text{Eq. 4}$$

$$a = c^{1/2}/(4\Sigma N)^{3/2}$$

$$b = c/(4N)$$

Over the temperature ranges typically encountered with raster scan machines $\omega(dose)/\omega(temperature)$ has been found to be nearly constant, but the above technique can be generalized to determine $\omega(dose)/\omega(temperature)$ as function of temperature.

Analyzing the Errors of the Scheme

The above scheme having been described, it will be evident to those with the necessary mathematical skill to implement it how to analyze the errors that may arise. This analysis needs to be done for each proposed scheme because the errors may be outside tolerance and require a finer cell division scheme or be so far within tolerance that a more economical processor is suggested. For completeness of exposition some methods of error analysis are described below:

Error can arise because we have approximated small kernel terms to zero. This error is easily analyzed by comparing the temperature computed for full coverage with and without this approximation. When the calculation extends sufficiently far down a stage scan it will be obvious when an asymptotic temperature is reached.

Because the kernel elements have their origin in an exact solution of the diffusion equation, the method of this invention will always yield a correct temperature for uniform coverage, except for the error discussed in the preceding paragraph, whether the coverage is 0%, or 100% or anything in between. However if the coverage is 50%, say, and not uniform, error can arise because the method assumes uniform coverage in each cell although it makes no such assumption from cell to cell. For each kernel element this error is easily estimated by comparing half its value with the temperature computed for its cell one half filled with 100% coverage, crowding the coverage closest or furthest from the point of correction. These deviations for each cell will allow a statistical estimate to be made of the aggregate error in accordance with the standard procedures of statistics.

Calculation of the Kernel Elements

It will be necessary to compute the kernel terms in a form similar to FIG. 5. This can be done by using Eq. 2 to sum over every writing pixel in each cell of the proposed scheme. Eq. 2 will linearly superpose the full coverage solution to Eq. 1 obtained by exact methods for a single fully exposed writing pixel. While this approach is desirable for the final computation of the values of the kernel of a working scheme, converging on that scheme may be a cut and try process that involves several trials to find a scheme that meets accuracy requirements that is within the capabilities of various processors. An expedient approach has been devised to accelerate this process: Embodiments of the present invention make optional use of an analytical approximation for resist heating that is accurate for raster scan machines, although not necessarily accurate for other writing strategies. It simplifies and greatly accelerates the prediction of raster scan temperature rise over exact methods. The analytical approximation for raster scan temperature rise is:

$$T(°K) = H[2a/(\Lambda+t)^{3/2}] \exp[-b(r^2\Gamma^2)/(\Lambda+t)] \qquad \text{Eq. 4}$$

where $a = c^{1/2}/(4\Sigma N)^{3/2}$ $b = c/(4N)$

Eq. 4

In cgs units we have

H=joules c=joules cm$^{-3}$°K$^{-1}$=volume specific heat

N=joules sec$^{-1}$ cm$^{-1}$°K$^{-1}$=thermal conductivity t=elapsed time in seconds r=surface distance between the heat source Hand the point at which the temperature is being determined (in cm)

When this equation is used for high beam voltage heating prediction, thermal conduction through the thin resist and chrome layers is ignorable and the substrate may be considered one material. This approximation is justified with raster scan because the method can ignore heating of the current flash by other proximate flashes in the current beam scan where conduction through the superficial layers may otherwise be significant.

Setting $\Gamma=0$ and $\Omega=0$ in Eq. 4 causes Eq. 4 to reduce to the classical impulse response solution to the diffusion equation called Green's function. Eq. 4 would be precise if the e-beam deposited heat zone were precisely Gaussian in shape with a centroid at depth $\Gamma$ and a diameter characterized by $\Omega$b. In practice, the heat zone is not Gaussian and Eq. 4 gives unreliable answers for small values of t. However, for raster scan e-beam machines, e-beam flashes close together in time correspond to flashes deposited in the same raster scan line. Typical raster scan machines move the e-beam sufficiently rapidly (approximately 50–100 meters/sec) that the writing e-beam is virtually unaffected by recent flashes deposited in the same beam scan line. That is, the e-beam outruns its own heat wave. Therefore, the temperature of the resist being written by the current flash will be virtually unaffected by flashes from the recent past in the same scan lines. Flashes in adjacent raster scan lines in close proximity to the point presently being written are very effective in changing the temperature of the resist, but were not written in the immediate past where Eq. 4 is inaccurate. Such adjacent flashes occurred on a time scale of tens of microseconds or more preceding present writing, ample time for heat to propagate from deep in the substrate where it was deposited to the site being written in the current beam scan path. In this regime, Eq. 4 is quite accurate.

The parameters in Eq. 4 are typically estimated by means of time consuming but accurate Monte Carlo simulations of heating source by a single e-beam flash used as a heat source in finite difference or finite element solutions to the classical diffusion equation. Least squares fit the single flash results are the preferred way to ascertain values for H $\Gamma$ and $\Omega$ in Eq. 4. For 50 keV beam energy in a glass substrate, typical values for $\Gamma$ are around 10 microns and $\Omega$ is about 10 microseconds. His the energy deposited per flash and will depend on the machine and resist being used but is approximately 10$^{-10}$ joules for a typical raster scan machine: it is not the flash beam energy directly because some energy is backscattered into the vacuum above the substrate. There may be about 10$^8$ flashes per mm$^2$ or 10$^{10}$ flashes per cm$^2$ resulting in around 1 joule per cm$^2$. The approximation given by Eq. 4 is found in comparison with Monte Carlo simulations and numerical integration of the thermal diffusion equation to be accurate to within a few percent but requiring very much less computer time to obtain the result. For economy of language, we denote as "shifted impulse response function" the temperature calculation given by Eq, 4 including the time shift $\Omega$ and the spatial displacement $\Gamma$.

Fitting to an exact calculation is the preferred way to obtain the parameters $\Gamma$ and $\Omega$ However, a heuristic interpretation of $\Gamma$ and $\Omega$ leads to similar numerical values and affords insight into the physical process. $\Gamma^2$ displaces the distance r$^2$ by an amount approximately compensating for the fact that e-beam energy is deposited below the surface on which the resist lies, r is the distance in the plane of the resist (xy) between the point at which temperature rise is required and the previously written pixel in the xy plane whose effect on the temperature at r is to be determined (denoted as "origin pixel"). But the e-beam energy used to write the origin pixel is chiefly deposited not in the xy plane of the resist but some distance below, typically around 10 microns at 50 kV. Displacing r in Eq. 4 by $\Gamma$ approximately adjusts for this displacement below the xy plane using the Pythagorean Theorem. This value of $\Gamma$ is supported by the Monte Carlo simulations that lead to substantially the same value.

There is also a heuristic interpretation for the addition of $\Omega$ to the time. The energy deposited in the substrate in writing the origin pixel is not deposited at a point, but in a diffuse zone due to electron diffusion. Thus, a response function appropriate for an impulse can be transformed to a gaussian by displacing time allowing us to simulate electron diffusion with thermal diffusion. The addition of $\Omega$ to the actual time in Eq. 4 mimics the effect that would be expected if the heat deposited in writing the origin pixel were deposited impulsively at a point, but spread according to the impulse response function for a time $\Omega$ before "starting the clock" on our calculation of heating at distance r.

Eq. 4 is thus used to evaluate the temperature rise at the point of writing (j in Eq. 3) from an origin pixel (i in Eq. 3). Eq. 4 can be used to determine the kernel K used in Eq. 3. The use of Eq. 4 is twofold: It may provide kernel terms K with enough accuracy for raster scan heating correction purposes. Even if more accurate final kernel terms are needed, it is invaluable in designing a heating correction scheme because following the scheme of this patent because it allows many alternatives to be explored quickly without the need for time consuming recalculations of the K by exact methods for the scenarios being explored.

Input Data for Proximity Heating Correction

It is important to emphasize that the input data to the proximity heating calculation of this invention should reflect the energy that is actually deposited into the substrate including all corrections to the dose including that of heating itself. Present and future writing is taken into account for proximity backscatter correction purposes because all writing within backscatter range of the current pixel backscatters electrons into it. This requires a correction to the dose of the current pixel. However, the proximity heating processor determines the temperature of the resist where the present pixel is about to be written but this depends only on past writing.

It may appear that there is are complicated cross terms between the proximity backscatter correction and the proximity heating correction. However, to a good degree of approximation, when the heating processor adjusts the current pixel dose it also adjusts the dose of all the backscattered electrons that the current pixel will cause. Because proximity heating is diffused by the same diffusion that causes backscatter and because there is also further thermal diffusion, the temperature of the resist is approximately constant over the backscatter range so in compensating for the direct pixel dose, the heating processor also approximately corrects the exposure of its backscatter. For this reason the proximity backscatter correction can explicitly ignore resist heating by assuming that the proximity heating correction will correct both the direct exposure and the backscatter it causes, making it appear in effect that the both exposures take place on a resist of constant temperature. For this reason the heating processor can explicitly ignore future writing because it only affects present writing through backscatter. When the writing of a future pixel occurs within backscatter range of the present pixel, the temperature of the resist then may be different, but it will be known at that time to the heating processor which will compensate the dose not only for the future pixel when it is written but also for the backscatter it causes into the present region of writing. The errors in these assumptions are that the temperature is not exactly constant over the backscatter disk and the backscatter electrons cause less direct heating of the resist than the pixel exposure. These errors have been investigated and found to be within tolerance for typical raster scan lithography.

Proximity heating data derived by the methods according to embodiments of the present invention are typically returned to the e-beam writing instrument for use in adjusting the writing to compensate for the temperature-induced change in the resist sensitivity. The temperature rise must be converted into a dose adjustment using information concerning the thermal sensitivity of the resist in use. The specific manner in which the e-beam will be adjusted will depend significantly on the details of the particular e-beam machine. The beam current may be adjusted in response to the proximity heating or should current adjustment be infeasible or impractical, flash dwell time may also be adjusted. The specific manner of adjusting the e-beam in response to the information provided by embodiments of the present invention and other necessary corrections will largely be determined by the characteristics of the e-beam machine being used.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A method for correcting for proximity heating of resist in an electron beam lithography system, comprising:
    determining an increase of temperature at a writing point by grouping past pixel values as cells of varying size and using resulting cell values as scalar products with one or more predetermined kernels.

2. A method according to claim 1, wherein boundaries of said cells are selected such that a temperature contribution from said cells is substantially independent of a distribution of values within the cell.

3. A method according to claim 1, wherein cell boundaries are selected such that a grouping of kernel values is substantially symmetric about a correction point.

4. A method according to claim 1, wherein cell sizes are selected such that kernel values are approximately equal in value.

5. A method according to claim 1, further comprising compensating for the effect of resist heating due to past writing on the exposure of the resist by backscattered electrons associated with the current flash.

6. A method according to claim 1, wherein cells include varying, generally greater numbers of pixels as distance from a point of writing increases, which cells may include contiguous or non-contiguous regions of writing.

7. A system according to claim 1, wherein said cells are of varying size.

8. A system, comprising:
    a lithographic printing machine; and one or more control processors, said one or more processors adapted to compensate for proximity resist heating by applying a kernel of values to one or more cells of pixels to determine a temperature effect of previously written pixels on a current writing pixel for determining the exposure compensation necessary to compensate for the temperature change on the lithographic quality due to earlier writing.

9. A system according to claim 8, further including one or more memory devices adapted to store determinations of cells such that cells closer to a writing pixel include relatively fewer pixels and cells farther from said writing pixel include relatively more pixels.

10. A system according to claim 9, wherein said one or more store kernels determined by approximating a pixel value distribution within said cells with a uniform distribution of values and solving a thermal diffusion equation.

11. A system according to claim 10, wherein said applying said kernel further comprises grouping cells to minimize a number of calculations required to apply said kernel by varying the size, shape and contiguity of cells.

12. A system according to claim 8, wherein said cells are of varying shape.

13. A method, comprising:
    determining a set of kernel values by solving a thermal diffusion equation for a plurality of cells of varying size, said cells comprising groupings of pixels assumed to have a uniform distribution of values within said cells;

applying resulting kernel values during writing to a coverage map arranged as said plurality of cells.

14. A method according to claim 13, comprising determining a cell arrangement by defining a number of bands in a beam-scan direction and varying a size of said cells in a stage-scan direction.

15. A method according to claim 14, wherein boundaries of said cells are chosen with reference to a writing point such that said kernel is symmetric and independent of the point of writing.

16. A method according to claim 13, wherein cell are generated from bands in the stage scan direction where the band height in the beam scan direction is scaled by the dimensions of electron diffusion in the substrate material.

17. A method according to claim 13, wherein cells may be comprised of varying numbers of bands in the beam scan direction when the band cells would have a substantially common kernel value.

18. A method according to claim 13, wherein cells may be comprised of groupings of band cells that are non contiguous but which would have a substantially common kernel value.

19. A method according to claim 18, further comprising applying a shifted impulse response unction during said determining.

20. A method according to claim 13, wherein said cells are of varying shape.

* * * * *